United States Patent
Stengel et al.

(10) Patent No.: US 9,564,880 B2
(45) Date of Patent: Feb. 7, 2017

(54) SYSTEMS AND METHODS FOR GENERATING INJECTION-LOCKED, FREQUENCY-MULTIPLIED OUTPUT SIGNALS

(71) Applicant: MOTOROLA SOLUTIONS, INC., Schaumburg, IL (US)

(72) Inventors: Robert E. Stengel, Pompano Beach, FL (US); Nicholas G. Cafaro, Parkland, FL (US)

(73) Assignee: MOTOROLA SOLUTIONS, INC., Chicago, IL (US)

(*) Notice: Subject to any disclaimer, the term of this patent is extended or adjusted under 35 U.S.C. 154(b) by 2 days.

(21) Appl. No.: 14/581,337

(22) Filed: Dec. 23, 2014

(65) Prior Publication Data

US 2016/0181980 A1 Jun. 23, 2016

(51) Int. Cl.
*H03K 3/03* (2006.01)
*H03K 5/00* (2006.01)

(52) U.S. Cl.
CPC ........ *H03K 3/0315* (2013.01); *H03K 5/00006* (2013.01)

(58) Field of Classification Search
CPC ......... H03B 19/00; H03B 19/06; H03B 19/08; H03B 19/10; H03B 19/14; H03K 5/00006; H03K 7/06
See application file for complete search history.

(56) References Cited

U.S. PATENT DOCUMENTS

| | | | |
|---|---|---|---|
| 5,180,994 A | 1/1993 | Martin et al. | |
| 5,239,274 A * | 8/1993 | Chi | H03B 5/20 331/108 B |
| 5,970,110 A | 10/1999 | Li | |
| 6,295,328 B1 | 9/2001 | Kim et al. | |
| 6,617,936 B2 * | 9/2003 | Dally | H03K 3/0315 331/172 |
| 7,010,074 B2 | 3/2006 | Nakamura | |
| 7,154,978 B2 | 12/2006 | Juan et al. | |
| 7,683,725 B2 | 3/2010 | Kim et al. | |
| 7,869,769 B2 | 1/2011 | Stengel et al. | |
| 7,872,509 B2 | 1/2011 | Yang et al. | |
| 7,884,660 B2 | 2/2011 | Delage et al. | |
| 7,940,098 B1 | 5/2011 | Kwasniewski et al. | |
| 8,232,844 B2 * | 7/2012 | Maruko | G06F 1/12 327/141 |

(Continued)

*Primary Examiner* — Thomas J Hiltunen
(74) *Attorney, Agent, or Firm* — Barbara R. Doutre

(57) ABSTRACT

Disclosed herein are systems and methods for generating injection-locked, frequency-multiplied output signals. In an embodiment, a circuit includes a ring of a number (N) serially connected delay-buffer elements and an injection-pulse-generation circuit. Each delay-buffer element provides a time delay (D), and at least some of them have at least one pulse-locking injection port. The injection-pulse-generation circuit is configured to transmit balanced-delay injection-pulse signals—that are generated by applying balanced-delay selection logic to a clock signal according to pulse-selection control signals—to the pulse-locking injection ports to provide, at the ring output port, an injection-locked, frequency-multiplied output signal having a frequency that equals the reciprocal of (N*D) and that bears the same proportional relationship to the frequency of the clock signal that the period of the clock signal bears to (N*D).

14 Claims, 21 Drawing Sheets

(56) References Cited

U.S. PATENT DOCUMENTS

| | | | |
|---|---|---|---|
| 8,487,670 B2 | 7/2013 | Fagg | |
| 8,570,109 B2 * | 10/2013 | Song | H03K 3/0322 327/233 |
| 8,742,855 B2 * | 6/2014 | Shin | H03K 3/0322 327/288 |
| 8,854,091 B2 * | 10/2014 | Hossain | H03B 19/00 327/116 |
| 9,077,348 B1 * | 7/2015 | Liu | H03L 7/06 |
| 2002/0171496 A1 * | 11/2002 | Jordan | H03K 3/0315 331/57 |
| 2004/0212406 A1 | 10/2004 | Jung | |
| 2009/0175116 A1 * | 7/2009 | Song | G11C 7/22 365/233.12 |
| 2012/0161827 A1 | 6/2012 | Madeira et al. | |
| 2012/0268177 A1 * | 10/2012 | Hogeboom | H03L 7/099 327/156 |
| 2013/0135019 A1 | 5/2013 | Bhullar et al. | |
| 2013/0241662 A1 * | 9/2013 | Aleksic | H03K 3/0315 331/173 |
| 2015/0188554 A1 * | 7/2015 | Chong | H03K 3/0231 327/158 |
| 2015/0333760 A1 * | 11/2015 | Zerbe | H03K 3/0315 331/25 |

* cited by examiner

300

(EXAMPLE A)

| TIME | SB 120A | SB 121A | RISING-EDGE INPUT | RISING-EDGE OUTPUT | FALLING-EDGE INPUT | FALLING-EDGE OUTPUT |
|---|---|---|---|---|---|---|
| t = 305 | 0 | 0 | CLK 111A | OUT 274A | $\overline{\text{CLK}}$ 112A | OUT 272A |
| t = 310 | 1 | 0 | $\overline{\text{CLK}}$ 112A | OUT 271A | CLK 111A | OUT 273A |
| t = 315 | 0 | 1 | CLK 111A | OUT 272A | $\overline{\text{CLK}}$ 112A | OUT 274A |
| t = 320 | 1 | 1 | $\overline{\text{CLK}}$ 112A | OUT 273A | CLK 111A | OUT 271A |
| t = 325 | 0 | 0 | CLK 111A | OUT 274A | $\overline{\text{CLK}}$ 112A | OUT 272A |
| t = 330 | 1 | 0 | $\overline{\text{CLK}}$ 112A | OUT 271A | CLK 111A | OUT 273A |
| t = 335 | 0 | 1 | CLK 111A | OUT 272A | $\overline{\text{CLK}}$ 112A | OUT 274A |

(EXAMPLE B)

| TIME | SB 120B | SB 121B | RISING-EDGE INPUT | RISING-EDGE OUTPUT | FALLING-EDGE INPUT | FALLING-EDGE OUTPUT |
|---|---|---|---|---|---|---|
| t = 507 | 0 | 0 | CLK 111B | OUT 274B | $\overline{\text{CLK}}$ 112B | OUT 272B |
| t = 514 | 1 | 0 | $\overline{\text{CLK}}$ 112B | OUT 273B | CLK 111B | OUT 271B |
| t = 521 | 0 | 1 | CLK 111B | OUT 272B | $\overline{\text{CLK}}$ 112B | OUT 274B |
| t = 528 | 1 | 1 | $\overline{\text{CLK}}$ 112B | OUT 271B | CLK 111B | OUT 273B |
| t = 535 | 0 | 0 | CLK 111B | OUT 274B | $\overline{\text{CLK}}$ 112B | OUT 272B |
| t = 542 | 1 | 0 | $\overline{\text{CLK}}$ 112B | OUT 273B | CLK 111B | OUT 271B |

(EXAMPLE C)

| TIME | SB 920C | SB 921C | SB 922C | RISING-EDGE INPUT | RISING-EDGE OUTPUT | FALLING-EDGE INPUT | FALLING-EDGE OUTPUT |
|---|---|---|---|---|---|---|---|
| t = 1011 | 0 | 0 | 0 | CLK 911C | OUT 978C | $\overline{\text{CLK}}$ 912C | OUT 974C |
| t = 1022 | 1 | 0 | 0 | $\overline{\text{CLK}}$ 912C | OUT 973C | CLK 911C | OUT 977C |
| t = 1033 | 0 | 1 | 0 | CLK 911C | OUT 976C | $\overline{\text{CLK}}$ 912C | OUT 972C |
| t = 1044 | 1 | 1 | 0 | $\overline{\text{CLK}}$ 912C | OUT 971C | CLK 911C | OUT 975C |
| t = 1055 | 0 | 0 | 1 | CLK 911C | OUT 974C | $\overline{\text{CLK}}$ 912C | OUT 978C |
| t = 1066 | 1 | 0 | 1 | $\overline{\text{CLK}}$ 912C | OUT 977C | CLK 911C | OUT 973C |
| t = 1077 | 0 | 1 | 1 | CLK 911C | OUT 972C | $\overline{\text{CLK}}$ 912C | OUT 976C |
| t = 1088 | 1 | 1 | 1 | $\overline{\text{CLK}}$ 912C | OUT 975C | CLK 911C | OUT 971C |

(EXAMPLE D)

| TIME | SB 920D | SB 921D | SB 922D | RISING-EDGE INPUT | RISING-EDGE OUTPUT | FALLING-EDGE INPUT | FALLING-EDGE OUTPUT |
|---|---|---|---|---|---|---|---|
| t = 1207 | 0 | 0 | 0 | CLK 911D | OUT 978D | $\overline{\text{CLK}}$ 912D | OUT 974D |
| t = 1214 | 1 | 0 | 0 | $\overline{\text{CLK}}$ 912D | OUT 977D | CLK 911D | OUT 973D |
| t = 1221 | 0 | 1 | 0 | CLK 911D | OUT 976D | $\overline{\text{CLK}}$ 912D | OUT 972D |
| t = 1228 | 1 | 1 | 0 | $\overline{\text{CLK}}$ 912D | OUT 975D | CLK 911D | OUT 971D |
| t = 1235 | 0 | 0 | 1 | CLK 911D | OUT 974D | $\overline{\text{CLK}}$ 912D | OUT 978D |
| t = 1242 | 1 | 0 | 1 | $\overline{\text{CLK}}$ 912D | OUT 973D | CLK 911D | OUT 977D |
| t = 1249 | 0 | 1 | 1 | CLK 911D | OUT 972D | $\overline{\text{CLK}}$ 912D | OUT 976D |
| t = 1256 | 1 | 1 | 1 | $\overline{\text{CLK}}$ 912D | OUT 971D | CLK 911D | OUT 975D |

(EXAMPLE E)

| TIME | SB 1520E | SB 1521E | RISING-EDGE INPUT | RISING-EDGE OUTPUT | FALLING-EDGE INPUT | FALLING-EDGE OUTPUT |
|---|---|---|---|---|---|---|
| t = 1805 | 0 | 0 | CLK 1511E | OUT 1674E | $\overline{\text{CLK}}$ 1512E | OUT 1672E |
| t = 1810 | 1 | 0 | $\overline{\text{CLK}}$ 1512E | OUT 1671E | CLK 1511E | OUT 1673E |
| t = 1815 | 0 | 1 | CLK 1511E | OUT 1672E | $\overline{\text{CLK}}$ 1512E | OUT 1674E |
| t = 1820 | 1 | 1 | $\overline{\text{CLK}}$ 1512E | OUT 1673E | CLK 1511E | OUT 1671E |
| t = 1825 | 0 | 0 | CLK 1511E | OUT 1674E | $\overline{\text{CLK}}$ 1512E | OUT 1672E |
| t = 1830 | 1 | 0 | $\overline{\text{CLK}}$ 1512E | OUT 1671E | CLK 1511E | OUT 1673E |
| t = 1835 | 0 | 1 | CLK 1511E | OUT 1672E | $\overline{\text{CLK}}$ 1512E | OUT 1674E |

*FIG. 18*

SYSTEMS AND METHODS FOR GENERATING INJECTION-LOCKED, FREQUENCY-MULTIPLIED OUTPUT SIGNALS

BACKGROUND OF THE INVENTION

Complex electronic devices are important in modern society and to the modern economy, and becoming more so all the time. Some examples of such devices include laptop computers, mobile phones (e.g., smartphones), tablets, Wi-Fi routers and other Wi-Fi access points, wireless-network base stations and other components, servers, routers, switches, transmitters, receivers, transceivers, and the like. Certainly numerous other examples of complex modern electronic devices could be listed here.

From the beginning of the modern electronics and computing age, and continuing up to and including the present day, the ability to generate precisely clocked electrical signals has been important for synchronizing the functions of multiple parts of computer processors and other electronic devices, and also for the synchronization of cooperative and/or complimentary functions of multiple electronic devices. In a typical example, an electric potential is applied to a quartz crystal, causing the quartz crystal to emit an electrical signal having a reliably fixed frequency. Such a signal then often forms the basis for what is referred to in the electronics arts as a "clock" signal for a given circuit or electronic device. This clock signal then drives the timing of the functioning of the various elements of the given circuit or electronic device, defining the points in time at which, for example, a given data register can be written, the given data register can be read, and the like.

In order to function properly and/or up to or near their full potential, some circuits and other electronic devices require clock signals having frequencies that are greater than the precise frequencies that can be generated by application of electricity to a naturally occurring material such as a quartz crystal. Accordingly, for this reason and others, there is a need for the presently disclosed systems and methods for generating injection-locked, frequency-multiplied output signals.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIG. 3 depicts a first example time-sequenced state table in accordance with a first example scenario, which involves use of the first example frequency-multiplication circuit of FIG. 2, in accordance with at least one embodiment.

FIG. 5 depicts a second example time-sequenced state table in accordance with a second example scenario, which involves use of the first example frequency-multiplication circuit of FIG. 2, in accordance with at least one embodiment.

FIG. 10 depicts a third example time-sequenced state table in accordance with a third example scenario, which involves use of the second example frequency-multiplication circuit of FIG. 9, in accordance with at least one embodiment.

FIG. 12 depicts a fourth example time-sequenced state table in accordance with a fourth example scenario, which involves use of the second example frequency-multiplication circuit of FIG. 9, in accordance with at least one embodiment.

FIG. 18 depicts a fifth example time-sequenced state table in accordance with a fifth example scenario, which involves use of the third example frequency-multiplication circuit of FIG. 15, in accordance with at least one embodiment.

Figure 1:
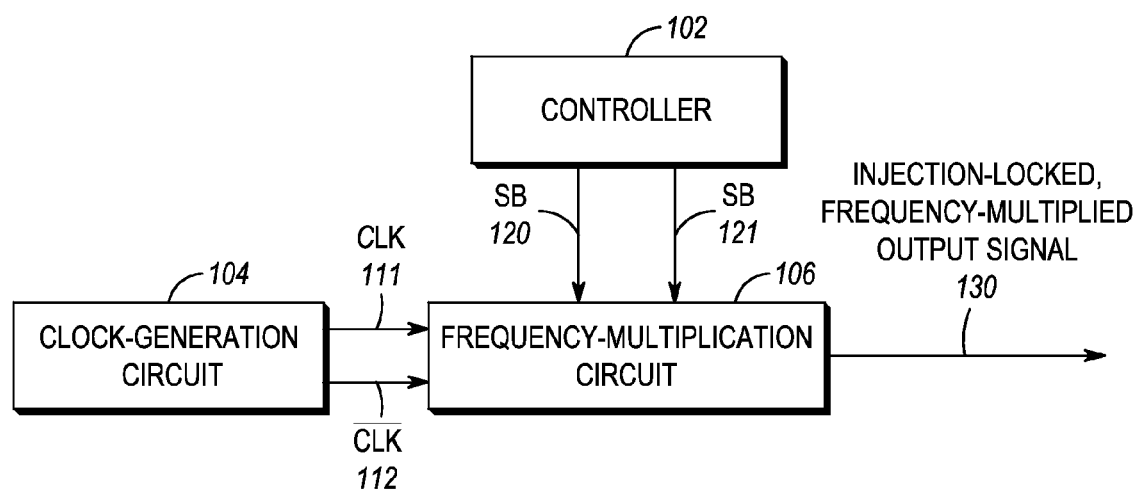
FIG. 1 depicts a first example circuit system that includes a first example frequency-multiplication circuit, in accordance with at least one embodiment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Disclosed herein are systems and methods for generating injection-locked, frequency-multiplied output signals.

An embodiment takes the form of a circuit system that includes a frequency-multiplication circuit, which itself includes a ring of a number (N) of serially connected delay-buffer elements and an injection-pulse-generation circuit. Each of the delay-buffer elements provides an equal time delay (D), and at least some of the delay-buffer elements have at least one pulse-locking injection port. The ring has a ring output port.

In this embodiment, the injection-pulse-generation circuit includes a clock input port, a pulse-selection input port, a plurality of injection-pulse output ports, and balanced-delay selection-logic circuitry. The clock input port is configured to receive a clock signal having a clock-signal frequency ($F_{CLK}$) and a corresponding clock-signal period ($T_{CLK}$). The pulse-selection input port is configured to receive pulse-selection control signals. The injection-pulse output ports are connected to respective pulse-locking injection ports of the delay-buffer elements. The balanced-delay selection-logic circuitry is connected to the clock input port, the pulse-selection input port, and the injection-pulse output ports.

In this embodiment, the injection-pulse generation circuit is configured to generate balanced-delay injection-pulse signals by applying the balanced-delay selection-logic circuitry to the clock signal according to the pulse-selection control signals. The injection-pulse generation circuit is further configured to provide an injection-locked, frequency-multiplied ring output signal at the ring output port by transmitting the generated balanced-delay injection-pulse signals via the injection-pulse output ports to the respectively connected pulse-locking injection ports, the ring output signal having an output-signal frequency ($F_{OUT}$) that equals the reciprocal of (N*D) and that bears the same proportional relationship to $F_{CLK}$ that $T_{CLK}$ bears to (N*D).

Another embodiment takes the form of a method carried out by a circuit system that includes a ring of a number (N) of serially connected delay-buffer elements that each provide an equal time delay (D), where at least some of the delay-buffer elements have at least one pulse-locking injection port, and where the ring has a ring output port. The method includes receiving a clock signal having a clock-signal frequency ($F_{CLK}$) and a corresponding clock-signal period ($T_{CLK}$). The method includes receiving pulse-selection control signals, and generating balanced-delay injection-pulse signals by applying balanced-delay selection-logic circuitry to the clock signal according to the pulse-selection control signals. The method also includes providing an injection-locked, frequency-multiplied output signal at the ring output port by transmitting the generated balanced-delay injection-pulse signals to respective ones of the pulse-locking injection ports, where the output signal has an output-signal frequency ($F_{OUT}$) that equals the reciprocal of (N*D) and that bears the same proportional relationship to $F_{CLK}$ that $T_{CLK}$ bears to (N*D).

Moreover, any of the variations and permutations that are described in the ensuing paragraphs and anywhere else in this disclosure can be implemented with respect to any embodiments, including with respect to any method embodiments and with respect to any system embodiments. Furthermore, this flexibility and cross-applicability of embodiments is present in spite of the use of slightly different language (e.g., process, method, steps, functions, set of functions, and the like) to describe and/or characterize such embodiments.

In at least one embodiment, the circuit system includes a clock-generation circuit configured to transmit the clock signal to the injection-pulse-generation circuit.

In at least one embodiment, the clock signal is an injection-locked signal.

In at least one embodiment, the circuit system includes a controller configured to transmit the pulse-selection control signals to the injection-pulse-generation circuit.

In at least one embodiment, N is an even number. In at least one such embodiment, N equals 4. In at least one other such embodiment, N equals 8. In at least one other such embodiment, N equals 16.

In at least one embodiment, at least one of the delay-buffer elements includes a pair of inverter circuits.

In at least one embodiment in which at least one of the delay-buffer elements includes a pair of inverter circuits, one or more of the pairs of inverter circuits is a pair of differential inverter circuits.

In at least one embodiment in which at least one of the delay-buffer elements includes a pair of inverter circuits, one or more of the inverter circuits includes serially connected complementary-metal-oxide-semiconductor (CMOS) field-effect transistors (FETs) connected at an inverter output node, and the corresponding pulse-locking injection ports include gate inputs to at least one parallel FET connected to the inverter output node. In at least one such embodiment, the parallel FET has a size smaller than a corresponding serially connected CMOS FET.

In at least one embodiment, each of the delay-buffer elements includes a pair of inverter circuits.

In at least one embodiment, at least one of the pulse-locking injection ports is a rising-edge pulse-locking injection port.

In at least one embodiment, at least one of the pulse-locking injection ports is a falling-edge pulse-locking injection port.

In at least one embodiment, each of the delay-buffer elements has at least one pulse-locking injection port connected to a respective one of the injection-pulse output ports of the injection-pulse-generation circuit.

In at least one embodiment in which each of the delay-buffer elements has at least one pulse-locking injection port connected to a respective one of the injection-pulse output ports of the injection-pulse-generation circuit, each of those pulse-locking injection ports includes a rising-edge pulse-locking injection port. In at least one such embodiment, each of those pulse-locking injection ports also includes a falling-edge pulse-locking injection port.

In at least one embodiment in which each of the delay-buffer elements has at least one pulse-locking injection port connected to a respective one of the injection-pulse output ports of the injection-pulse-generation circuit, each of those pulse-locking injection ports includes a falling-edge pulse-locking injection port.

In at least one embodiment, generating the balanced-delay injection-pulse signals by applying the balanced-delay selection-logic circuitry to the clock signal according to the pulse-selection control signals includes generating one or more rising-edge injection-pulse signals responsive to one or more respective rising edges of the clock signal. In at least one such embodiment, generating the balanced-delay injection-pulse signals by applying the balanced-delay selection-logic circuitry to the clock signal according to the pulse-selection control signals also includes generating one or more falling-edge injection-pulse signals responsive to one or more respective falling edges of the clock signal.

In at least one embodiment, generating the balanced-delay injection-pulse signals by applying the balanced-delay selection-logic circuitry to the clock signal according to the pulse-selection control signals includes generating one or more falling-edge injection-pulse signals responsive to one or more respective falling edges of the clock signal.

In at least one embodiment, the injection-pulse-generation circuit includes an inverse-clock input port configured to receive an inverse clock signal, which has an inverse-clock-signal frequency ($F_{\overline{CLK}}$) equal to $F_{CLK}$ and that is out of phase with the clock signal by 180 degrees, and the injection-pulse-generation circuit is also configured to generate the injection-pulse signals by applying the balanced-delay selection-logic circuitry to the inverse clock signal according to the pulse-selection control signals. In at least one such embodiment, generating the injection-pulse signals by applying the balanced-delay selection-logic circuitry to the clock signal and to the inverse clock signal according to the pulse-selection control signals involves alternating between (i) generating (a) one or more rising-edge injection-pulse signals responsive to a rising edge of the clock signal and (b) one or more falling-edge injection-pulse signals responsive to a falling edge of the inverse clock signal and (ii) generating (a) one or more rising-edge injection-pulse signals responsive to a rising edge of the inverse clock signal and (b) one or more falling-edge injection-pulse signals responsive to a falling edge of the clock signal. In at least one embodiment, the inverse clock signal is an injection-locked signal.

In at least one embodiment, the frequency-multiplication circuit includes N output ports (including the ring output port) connected to outputs of the respective N delay-buffer elements; the N output ports collectively provide N different phase-offset, injection-locked, frequency-multiplied output signals (including the ring output signal), and each of the N output signals has a frequency equal to $F_{OUT}$. In at least one such embodiment, the circuit system includes an output-signal-processing circuit that is configured to (i) receive and generate a duty-cycle-reduced version of each of the N different phase-offset, injection-locked, frequency-multiplied output signals and (ii) output the generated N different duty-cycle-reduced versions, each having a duty cycle equal to $$\frac{100\%}{N}.$$

In at least one such embodiment, the output-signal-processing circuit is configured to output the generated N different duty-cycle-reduced versions to an N-path network.

Before proceeding with this detailed description, it is noted that the entities, connections, arrangements, and the like that are depicted in—and described in connection with—the various figures are presented by way of example and not by way of limitation. As such, any and all statements or other indications as to what a particular figure "depicts," what a particular element or entity in a particular figure "is" or "has," and any and all similar statements—that may in isolation and out of context be read as absolute and therefore limiting—can only properly be read as being constructively preceded by a clause such as "In at least one embodiment, . . . " And it is for reasons akin to brevity and clarity of presentation that this implied leading clause is not repeated ad nauseum in this detailed description.

FIG. 1 depicts an example circuit system 100 that includes an example frequency-multiplication circuit 106, in accordance with at least one embodiment. In the depicted embodiment, the example circuit system 100 includes a controller 102, a clock-generation circuit 104, and a frequency-multiplication circuit 106. The clock-generation circuit 104 transmits a clock signal (CLK) 111 and an inverse clock signal ($\overline{CLK}$) ("clock bar") 112 to the frequency-multiplication circuit 106. The controller 102 transmits pulse-selection control signals—represented as two selection bits ("SBs") 120 and 121—to the frequency-multiplication circuit 106, which is configured in the depicted embodiment to provide (i.e., output) an injection-locked, frequency-multiplied output signal 130 (a.k.a. the "ring output signal 130").

Figure 2:
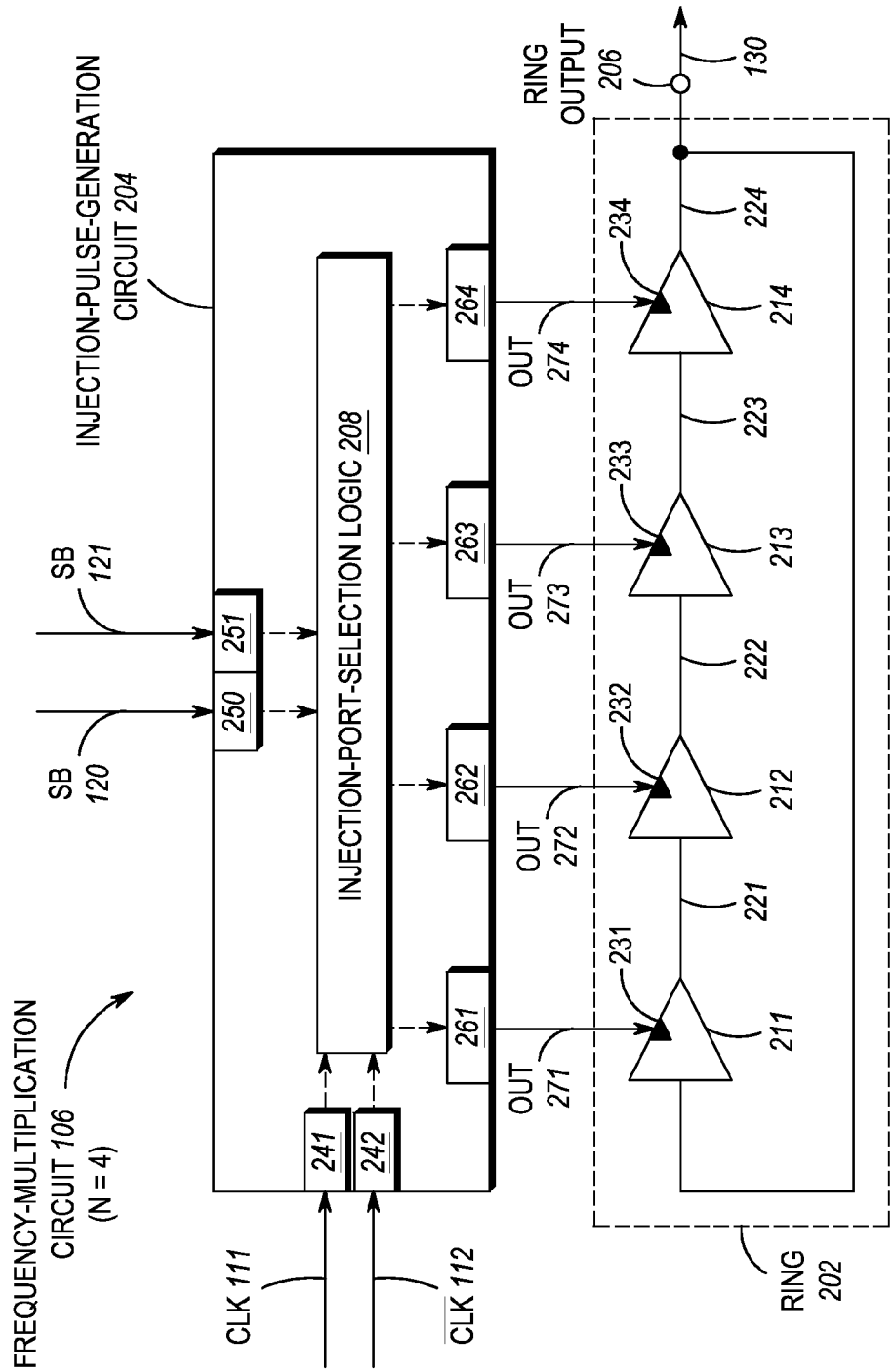
FIG. 2 depicts the first example frequency-multiplication circuit of FIG. 1, in accordance with at least one embodiment.

FIG. 2 is a diagram 200 of the example frequency-multiplication circuit 106 of FIG. 1, in accordance with at least one embodiment. In at least one embodiment, a frequency-multiplication circuit includes a ring of a number (N) of serially connected delay-buffer elements, and also includes an injection-pulse-generation circuit. In the embodiment that is depicted in FIG. 2, the example frequency-multiplication circuit 106 includes a ring 202 and an injection-pulse-generation circuit 204.

The ring 202 is a ring of 4 serially connected delay-buffer elements 211-214. Thus, in the depicted embodiment, N=4. Each of the delay-buffer elements 211-214 provides an equal time delay (D), and at least some of the delay-buffer elements 211-214 have at least one pulse-locking injection port. In the depicted embodiment, each of the four delay-buffer elements 211-214 has a respective pulse-locking injection port 231-234, via which the delay-buffer elements 211-214 receive the respective below-described injection-pulse signals 271-274. The ring 202 has a ring output port 206, at which is provided the above-mentioned (ring) output signal 130.

Each of the delay-buffer elements 211-214 has an input on its left side and an output on its right side. A signal 221 is present at the output of the delay-buffer element 211 and at the input of the delay-buffer element 212. A signal 222 is present at the output of the delay-buffer element 212 and at the input of the delay-buffer element 213. A signal 223 is present at the output of the delay-buffer element 213 and at the input of the delay-buffer element 214. A signal 224 is present at the output of the delay-buffer element 214 and at the input of the delay-buffer element 211. The signal 224 is also present at the ring output port 206 having the label output signal 130.

The injection-pulse-generation circuit 204 includes a clock input port 241 that is configured to receive the clock signal 111 from the clock-generation circuit 104, as well as an inverse-clock input port 242 that is configured to receive the inverse clock signal 112 from the clock-generation circuit 104. The injection-pulse-generation circuit 204 also includes a pulse-selection input port 250-251 that is configured to receive pulse-selection control signals (that include SBs 120 and 121) from the controller 102. The injection-pulse-generation circuit 204 also includes balanced-delay selection-logic circuitry that is labeled injection-port-selection logic 208 in FIG. 2. The injection-pulse-generation circuit 204 also includes a plurality of injection-pulse output ports 261-264 that are connected to respective pulse-locking injection ports 231-234 of the delay-buffer elements 211-214. As can be seen in FIG. 2, the injection-port-selection logic 208 is connected to the clock input port 241, the inverse-clock input port 242, the pulse-selection port 250-251, and the injection-pulse output ports 261-264 (via which are transmitted respective injection-pulse output signals 271-274).

Figure 4:
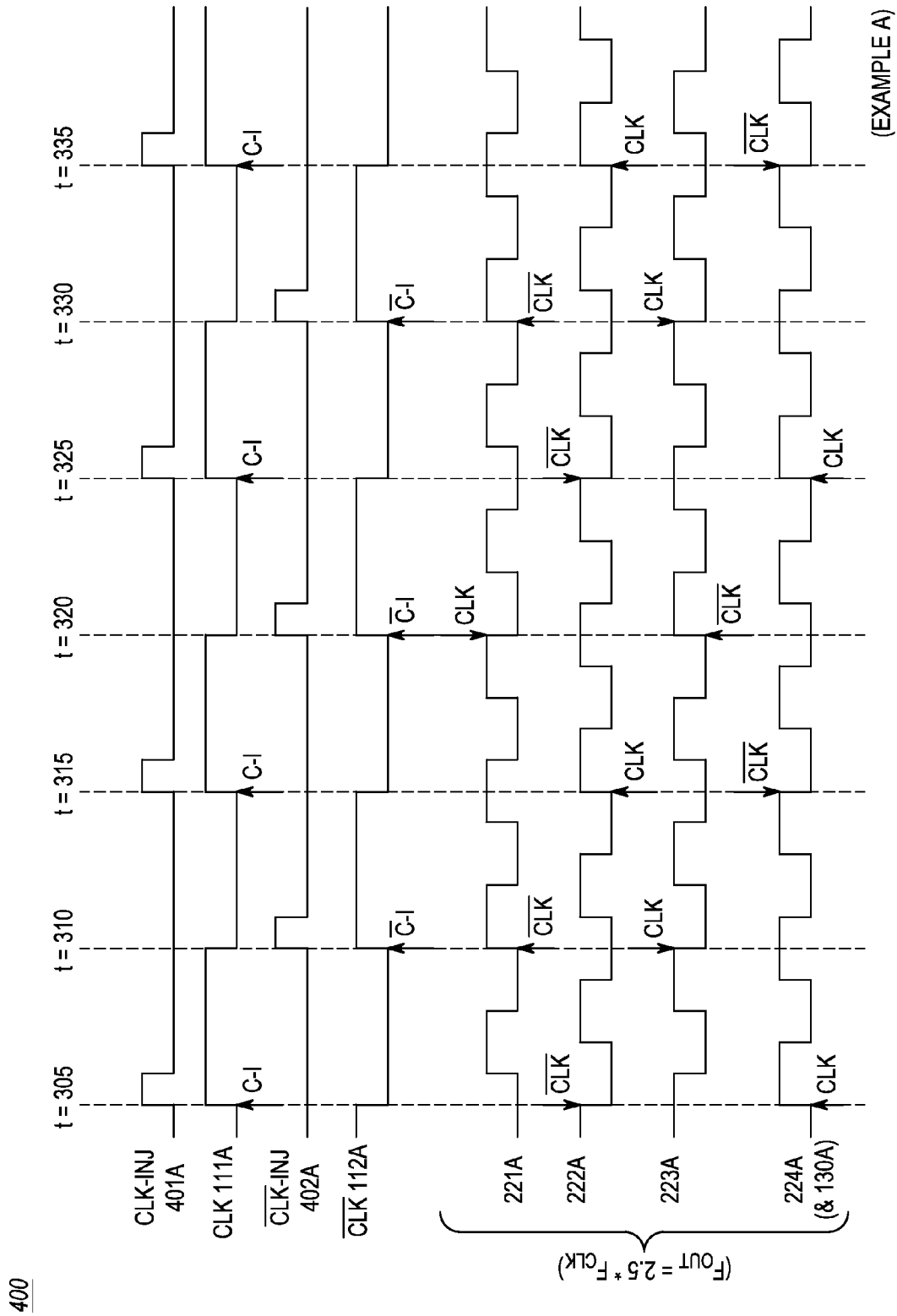
FIG. 4 depicts a first example timing diagram, which corresponds to the first example time-sequenced state table of FIG. 3, in accordance with at least one embodiment.

The ensuing paragraphs describe two different example scenarios (that are respectively described herein as "Example A" and "Example B") that each involve use of the example frequency-multiplication circuit 106 of FIG. 2. FIGS. 3 and 4 pertain to Example A. FIGS. 4 and 5 pertain to Example B.

FIG. 3 depicts an example time-sequenced state table 300 in accordance with Example A, which involves use of the example frequency-multiplication circuit 106 of FIG. 2, in accordance with at least one embodiment. The table 300 has seven columns, respectively labeled "Time," "SB 120A," "SB 121A," "Rising-Edge Input," "Rising-Edge Output," "Falling-Edge Input," and "Falling-Edge Output." Furthermore, in addition to the just-described header row, the table 300 has seven data rows that correspond respectively to the following time values: t=305, t=310, t=315, t=320, t=325, t=330, and t=335. It is noted that these time values are purposefully not labeled with particular units of time, and thus represent abstract units of time that are used in this disclosure to illustrate examples of the present systems and methods.

Moreover, in each of the five described examples (i.e., Examples "A" through "E"), the reference numerals for various signals are appended with capital letters indicative of the example to which they pertain. Thus, for instance, clock signal 111 is referred to in (and in connection with) FIGS. 3 and 4 as clock signal 111A ("CLK 111A"), while clock signal 111 is referred to in (and in connection with) FIGS. 5 and 6 as clock signal 111B ("CLK 111B"), and so on.

The table 300 depicts an example repeating pattern as to the values of SBs 120A and 121A. In particular, this pattern at successive intervals of 5 time units is 00, 10, 01, 11, 00, 10, 01 . . . . Furthermore, for each of the depicted time instances t=305 through t=335, the table 300 lists both (i) a rising-edge input and a corresponding rising-edge output and (ii) a falling-edge input and a corresponding falling-edge output. In a logical sense, then, at a given time instance (e.g., at time t=325), the digital-logic inputs are SB 120A, SB 121A, the rising-edge input, and the falling-edge input, while the digital-logic outputs are the rising-edge output and the falling-edge output. The data in the table 300 will be more readily understood with reference to the below description of FIG. 4, which as mentioned above also pertains to Example A.

It is noted that the rising-edge and falling-edge outputs are signals that are also referred to herein as "balanced-delay injection-pulse signals" referring to the fact that, in at least one embodiment, the injection-port-selection logic 240 is arranged such that all possible paths through its digital logic are designed to take the same amount of time; in at least one embodiment, this is accomplished by padding what would otherwise be shorter-time-duration logic paths with logic elements that take time but that do not ultimately modify output data values. And generally, the balanced-delay injection-pulse signals that are described herein are also at times referred to by simpler terms such as "injection-pulse signals" and "injection pulses."

FIG. 4 also pertains to Example A, and depicts an example timing diagram 400 that corresponds to the example time-sequenced state table 300 of FIG. 3, in accordance with at least one embodiment. The timing diagram 400 depicts the seven example time values from the table 300 of FIG. 3. In FIG. 4, those time values are listed horizontally in increasing order from left to right across the top of the timing diagram 400, each having a vertical dotted line extending downward therefrom, indicating events (and signal states) that occur at the respective time value to which the particular dotted line corresponds. The timing diagram 400 further includes listings of a number of signals on the left-hand side, along with respective pictorial depictions of those digital signals juxtaposed with the above-mentioned seven example time values.

Also depicted in FIG. 4 are a number of injection pulses. As a general matter, an injection pulse is an electrical signal that is sent to a given circuit element at a particular time in order to increase the precision of the timing of—i.e., to "injection lock"—an output signal of the given circuit element. In various different instances, this increase in precision could involve shifting an output signal a small amount ahead in time, delaying an output signal for a small amount of time, or perhaps not adjusting the timing of an output signal in instances in which that timing does not need adjustment. One example of a circuit element to which an injection pulse could be sent is a delay-buffer element such as the delay-buffer elements 211-214 of FIG. 2. Another example is an inverter. Moreover, a given delay-buffer element could be formed using a pair of inverters, as is known in the art. As described below, injection pulses could also be used within the clock-generation circuit 104 in order to increase the timing precision of the clock signal 111 and/or the inverse clock signal 112. And certainly other example uses of injection pulses could be listed here.

Among the signals depicted in the timing diagram 400 of FIG. 4 is a clock-injection signal (CLK-INJ) 401A and an inverse-clock-injection signal ($\overline{\text{CLK}}$-INJ) 402A. As can be seen in FIG. 4, the clock-injection signal 401A goes high for one time unit starting at t=305, t=315, t=325, and t=335, and is otherwise low. As such, it can be seen that the clock-injection signal 401A has a period of 10 (i.e., 10 time units). The inverse-clock-injection signal 402A also has a period of 10, and is out of phase with respect to the clock-injection signal 401A by 180 degrees (i.e., by one half period, which in this case equals 5 time units), and thus goes high for one time unit starting at t=310, t=320, and t=330, and is otherwise low. As is the case with all of the example signals that are represented in this disclosure, the example signals that are depicted in FIG. 4 are shown for only an arbitrary subset of time, and it will be understood by those of skill in the art that these signals extend substantially as depicted in both directions.

According to the depicted embodiment, each time the clock-injection signal 401A goes high, an injection pulse is delivered to the subcomponent of the clock-generation circuit 104 that is producing the clock signal 111; similarly, each time the inverse-clock-injection signal 402A goes high, an injection pulse is delivered to the subcomponent of the clock-generation circuit 104 that is producing the inverse clock signal 112. Thus, in at least one embodiment, both the clock signal 111 and the inverse clock signal 112 are themselves injection-locked signals.

As a guide to the reader, it is noted that injection pulses are depicted in FIG. 4 and in the other timing diagrams that are included in this disclosure using a combination of a vertical arrow and an abbreviation of the signal that is serving as the injection-locking signal (i.e., as the injection-pulse-triggering signal) with respect to the signal to which that arrow is pointing. In addition, the injection pulses that are described in this disclosure come in two varieties: rising-edge injection pulses and falling-edge injection pulses. In this disclosure, rising-edge injection pulses are depicted as up-pointing arrows that are positioned just below the rising edge of the signal for which those up-pointing arrows are serving as rising-edge injection pulses; examples of rising-edge injection pulses in FIG. 4 can be found just below the rising edges of the clock signal 111 that occur at t=305, t=315, t=325, and t=335. Complementarily, falling-edge injection pulses are depicted as down-pointing arrows that are positioned just above the falling edge of the signal for which those down-pointing arrows are serving as falling-edge injection pulses; examples of falling-edge injection pulses in FIG. 4 can be found just above the falling edges of the signal 223A that occur at t=310 and t=330.

Thus, it can be seen in FIG. 4 that, in the depicted embodiment, and as described above, the clock-injection signal 401A injection locks the clock signal 111A using rising-edge injection pulses, and the inverse-clock-injection signal 402A injection locks the inverse clock signal 112A, also using rising-edge injection pulses. The various coordinated rising-edge and falling-edge injection pulses—that are triggered by the injection-locked clock signal 111A and the injection-locked inverse-clock signal 112A according to the pulse-selection control signals (i.e., SB 120A and SB 121A) and the injection-port-selection logic 208—are further described below.

As described above, the signal 224A is present at the output of the delay-buffer element 214 and at the input of the delay-buffer element 211, and is also the ring output signal 130 that is present at the ring output port 206. As can be seen in FIG. 2, the injection pulses that would most directly impact the signal 224A would be those transmitted via the injection-pulse output port 264 as injection pulse output signals 274 to the delay-buffer element 214. As shown in FIG. 4, in Example A, the signal 224A receives (i) a rising-edge injection pulse based on the clock signal 111A (i.e., a "rising-edge clock injection pulse") at t=305, (ii) a falling-edge injection pulse based on the inverse clock signal 112A (i.e., a "falling-edge inverse-clock injection pulse") at t=315, (iii) another rising-edge clock injection pulse at t=325, and (iv) another falling-edge inverse-clock injection pulse at t=335. This matches the four occurrences of "OUT 274A" that appear in the table 300 of FIG. 3, which are (i) at t=305 as a rising-edge output that corresponds to the clock signal 111A as its rising-edge input, (ii) at t=315 as a falling-edge output that corresponds to the inverse clock signal 112A as its falling-edge input, (iii) at t=325 as a rising-edge output that corresponds to the clock signal 111A as its rising-edge input, and (iv) at t=335 as a falling-edge output that corresponds to the inverse clock signal 112A as its falling-edge input.

Thus, it can be appreciated from FIGS. 3 and 4 together that each rising edge of the clock signal 111A results in a rising-edge injection pulse being delivered with respect to the particular one of the four signals 221A-224A that has a co-occurring rising edge; this occurs with respect to the signal 222A at t=315 and at t=335, and also occurs with respect to the signal 224A at t=305 and at t=325. Also, each falling edge of the clock signal 111A results in a falling-edge injection pulse being delivered with respect to the particular one of the four signals 221A-224A that has a co-occurring falling edge; this occurs with respect to the signal 221A at t=320, and also occurs with respect to the signal 223A at t=310 and at t=330.

It can further be appreciated from FIGS. 3 and 4 together that each rising edge of the inverse clock signal 112A results in a rising-edge injection pulse being delivered with respect to the particular one of the four signals 221A-224A that has a co-occurring rising edge; this occurs with respect to the signal 221A at t=310 and at t=330, and also occurs with respect to the signal 223A at t=320. Also, each falling edge of the inverse clock signal 112A results in a falling-edge injection pulse being delivered with respect to the particular one of the four signals 221A-224A that has a co-occurring falling edge; this occurs with respect to the signal 222A at t=305 and at t=325, and also occurs with respect to the signal 224A at t=315 and at t=335.

As can be seen in FIG. 4, all four of the clock-injection signal 401A, the clock signal 111A, the inverse-clock-injection signal 402A, and the inverse clock signal 112A have a period equal to 10 time units, and thus have a frequency equal to 1 cycle per 10 time units (i.e., 1/10). In various places in this disclosure, the period of a given clock signal is expressed as $T_{CLK}$, while the frequency of a given clock signal is expressed as $F_{CLK}$. It is explicitly noted that, in this example and in all described examples, for simplicity of explanation and not by way of limitation, each delay-buffer element is configured to implement a delay (D) of 1 time unit. It can also be seen that the signal 224A, which is also the ring output signal 130 that is present at the ring output port 206, has a period of 4 and thus a frequency of 1/4, which is 2.5 times the frequency of the clock signal 111A. This proportional relationship is the same proportional relationship that the period (10) of the clock signal 111A bears to the product of N (4) and D (1); that is, 10/(4*1)=2.5. It can also be seen that each of the signals 221A-224A is shifted by 360/N degrees ahead of the signal that precedes it in the numerical order 221A-224A (where 224A precedes 221A in the ring configuration).

FIG. 5 depicts an example time-sequenced state table 500 in accordance with the above-mentioned Example B, which, like Example A, involves use of the example frequency-multiplication circuit 106 of FIG. 2, in accordance with at least one embodiment. Example B is similar in many ways to Example A, and thus is not described in as much detail. The table 500 of FIG. 5 differs from the table 300 of FIG. 3 in a number of ways, including that the time intervals are in increments of seven time units rather than five; the example times that are listed in the table 500 are t=507, t=514, t=521, t=528, t=535, and t=542. Purely by way of example and not limitation, six data rows are displayed in the example table 500.

Like the example table 300, the table 500 has a "Rising-Edge Input" column whose data values alternate between the clock signal 111B and the inverse clock signal 112B, and also has a "Falling-Edge Input" column whose data values alternate opposite to the "Rising-Edge Input" column between the inverse clock signal 112B and the clock signal 111B. The "Rising-Edge Output" column of the table 500 shows which rising-edge injection pulses are delivered at which times, while the "Falling-Edge Output" column shows which falling-edge injection pulses are delivered at which times. These various rising-edge and falling-edge injection pulses are depicted in FIG. 6.

Figure 6:
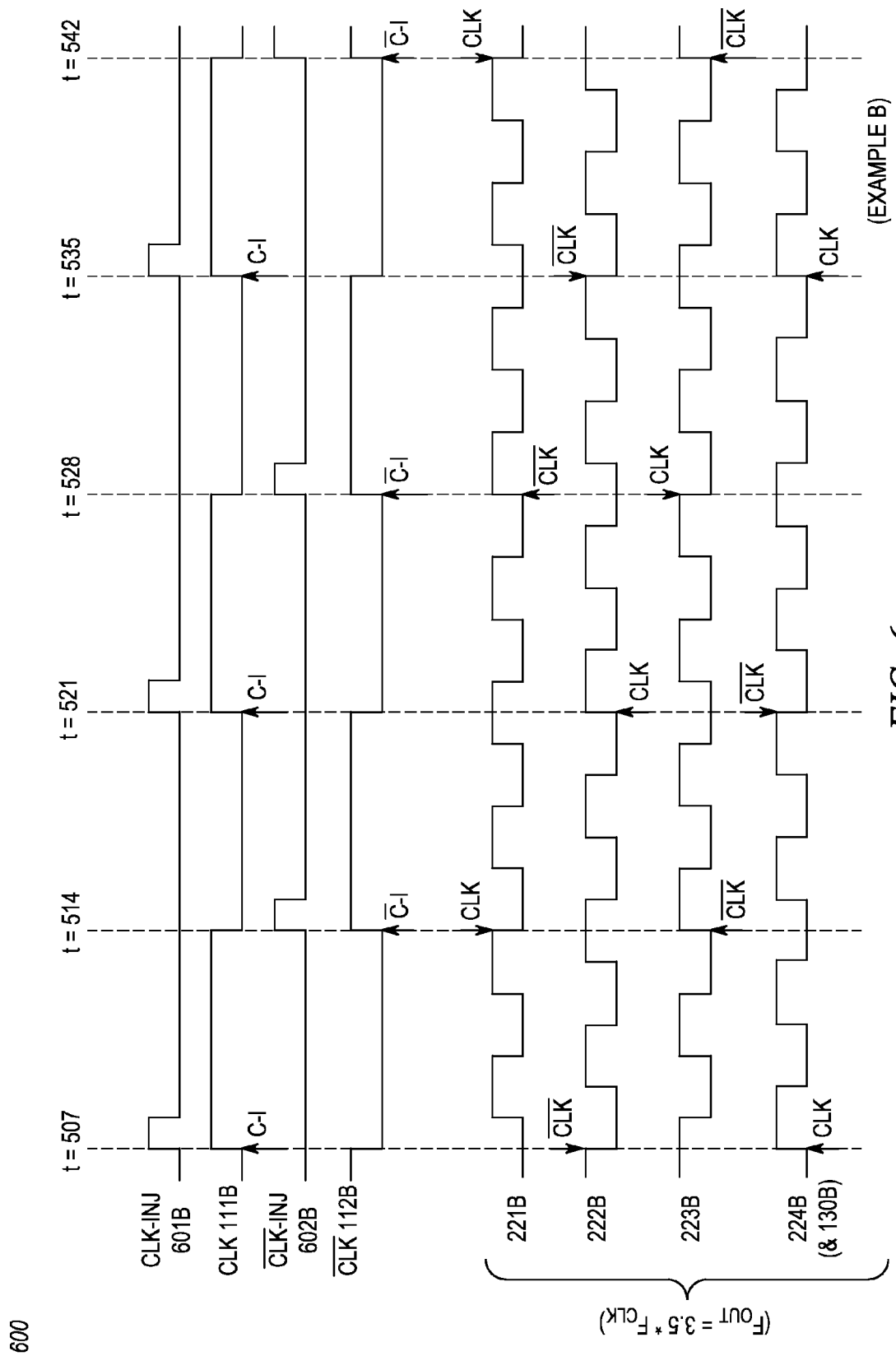
FIG. 6 depicts a second example timing diagram, which corresponds to the second example time-sequenced state table of FIG. 5, in accordance with at least one embodiment.

FIG. 6 also pertains to Example B, and depicts an example timing diagram 600 that corresponds to the example time-sequenced state table 500 of FIG. 5, in accordance with at least one embodiment. The timing diagram 600 of FIG. 6 is similar in a number of ways to the timing diagram 400 of FIG. 4, and thus is not described in as great of detail. A clock-injection signal 601B injection locks a clock signal 111B using rising-edge injection pulses at t=507, t=521, and t=535. Both of those signals have a period of 14 and thus a frequency of 1/14. An inverse-clock-injection signal 602B injection locks an inverse clock signal 112B, also using rising-edge injection pulses, at t=514, t=528, and t=542. Both of those signals also have a period of 14 and thus a frequency of 1/14.

Each of the four signals 221B-224B has a period of 4 and thus a frequency of 1/4, which is 3.5 times greater than the clock-signal frequency of 1/14. This 3.5 ratio is the same proportional relationship that the period of the clock signal (i.e., 14) bears to the product of the period of each of the signals 221B-224B (i.e., 4) and the time delay (i.e., 1) that is provided by each of the delay-buffer elements 211-214.

The signal 221B receives falling-edge clock injection pulses at t=514 and t=542, and receives a rising-edge inverse-clock injection pulse at t=528. The signal 222B receives falling-edge inverse-clock injection pulses at t=507 and t=535, and receives a rising-edge injection pulse at t=521. The signal 223B receives a falling-edge clock injection pulse at t=528, and receives rising-edge inverse-clock injection pulses at t=514 and t=542. The signal 224B, which is also the ring output signal 130B, receives a falling-edge inverse-clock injection pulse at t=521, and receives rising-edge clock injection pulses at t=507 and t=535.

Figure 7:
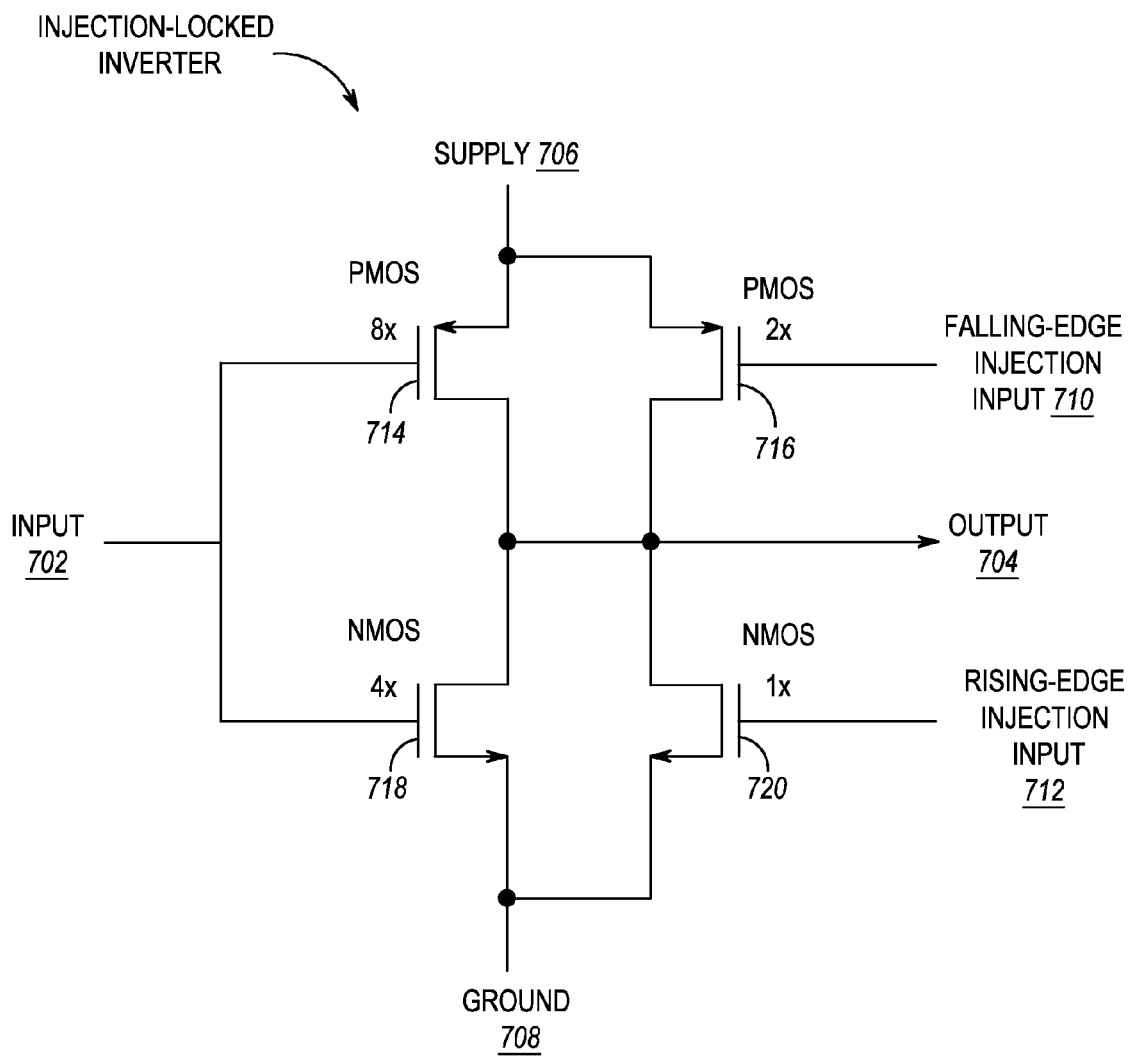
FIG. 7 depicts an example injection-locked inverter, in accordance with at least one embodiment.

FIG. 7 depicts an example injection-locked inverter 700, in accordance with at least one embodiment. The example injection-locked inverter 700 is depicted using the same left-to-right orientation as, e.g., the delay-buffer elements 211-214 of FIG. 2; as such, the example injection-locked inverter 700 has an input 702 on the left and has an output 704 on the right. The injection-locked inverter 700 also has a supply 706, a ground 708, a falling-edge injection input 710, and a rising-edge injection input 712.

The injection-locked inverter 700 includes two P-type MOS (PMOS) FETs 714 and 716, as well as two N-type MOS (NMOS) FETs 718 and 720. The input 702 is connected to the gates of both the PMOS FET 714 and the NMOS FET 718. The output 704 is connected to the drains of all four of the MOS FETs 714-720. The supply 706 is connected to the sources of both of the PMOS FETs 714 and 716. The ground 708 is connected to the sources of both of the NMOS FETs 718 and 720.

The NMOS FET 720 has a "1×" indication, while the PMOS FET 716 has a "2×" indication, the NMOS FET 718 has a "4×" indication, and the PMOS FET 714 has an "8×" indication. These various indications convey that the PMOS FET 714 is twice the size of the NMOS FET 718, which is twice the size of the PMOS FET 716, which is twice the size of the NMOS FET 720. It can be appreciated from these dimensions that the PMOS FET 714 bears a 4:1 size ratio to the PMOS FET 716, and that NMOS FET 718 bears the same 4:1 size ratio to the NMOS FET 720. The 2:1 size ratio that the PMOS FET 714 bears to the NMOS FET 718 is a typical PMOS-to-NMOS size ratio for achieving matching transition-rate and conductivity performance, among other example operating parameters that could be listed.

In operation, when the input 702 is low, the PMOS FET 714 will be on, connecting the supply 706 to the output 704, and the NMOS FET 718 will be off, disconnecting the ground 708 from the output 704, thus inverting the low input at 702 to a high output at 704. Complementarily, when the input 702 is high, the PMOS FET 714 will be off, disconnecting the supply 706 from the output 704, and the NMOS FET 718 will be on, connecting the ground 708 to the output 704, thus inverting the high input at 702 to a low output at 704.

When the input 702 transitions from high to low, this corresponds to a falling edge of the signal at the input 702. If, in connection with that falling edge of the signal at the input 702, a falling-edge injection pulse is applied to the falling-edge injection input 710, the PMOS FET 716 will be on for an amount of time that is brief in comparison with the amount of time that it takes the PMOS FET 714 to fully transition from being off to being on, and thus the amount of time that it takes for the signal at the output 704 to fully transition from low to high. For that brief time period (that both of the PMOS FETs 714 and 716 are on), their respective conductivities are summed due to their in-parallel arrangement.

This brief time period could occur after the PMOS FET 714 has already begun conducting, thus helping the signal at the output 704 to slightly correct its timing in instances where the conduction via the PMOS FET 714 was slightly ahead in time. As another possibility, this brief time period could occur before the PMOS FET 714 begins conducting, thus helping the signal at the output 704 to slightly correct its timing in instances where the conduction via the PMOS FET 714 was lagging slightly in time.

It will be understood by those having skill in the art that the operation in instances when the input 702 transitions from low to high will function in a similar manner with respect to the NMOS FET 718, the NMOS FET 720, and the rising-edge injection input 712. Those having skill in the art will further understand that a ring of an even number of injection-locked inverters similar to the example injection-locked inverter 700 of FIG. 7 could be used in various different embodiments of the present systems and methods, though the use of inverters in place of delay-buffer elements would of course invert some of the signals depicted in some of the timing diagrams that are included in and described in connection with this disclosure. Moreover, those of skill in the art will understand the adaptation needed to connect a pair of inverters for use as a single injection-locked delay-buffer element.

Figure 8:
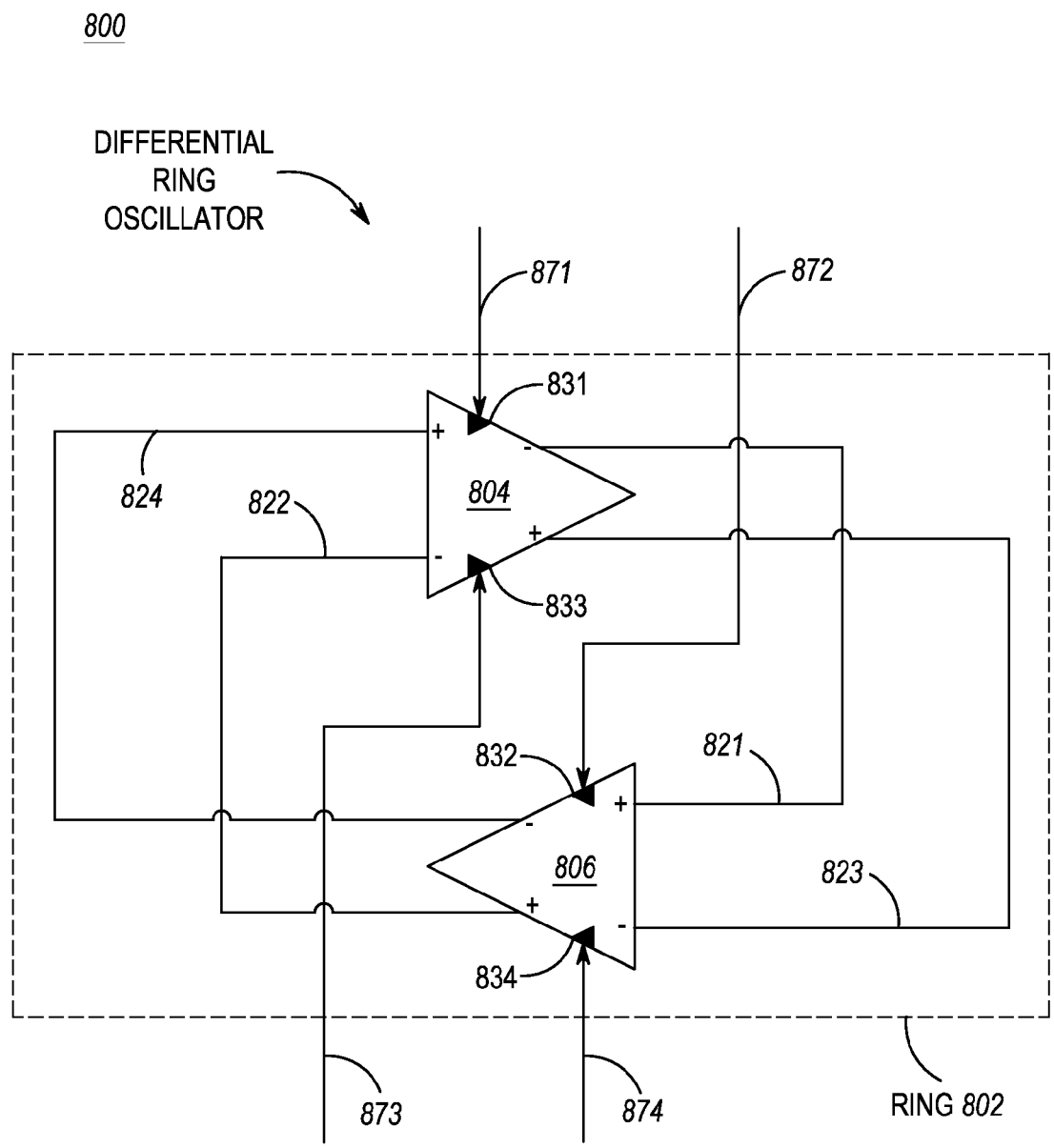
FIG. 8 depicts an example differential ring oscillator, in accordance with at least one embodiment.

FIG. 8 depicts an example differential ring oscillator 800, in accordance with at least one embodiment. It is noted that the reference numerals in FIG. 8 have been purposefully selected to be in parallel with the reference numerals that are used in the various other figures in this disclosure, including those that are used in FIG. 2. Those having skill in the art will understand that the differential type of implementation that is depicted in FIG. 8 is a design choice that some having skill in the art may deem suitable for a given context.

In the depicted embodiment, the example differential ring oscillator 800 includes a ring 802, which includes a differential inverter 804 and a differential inverter 806. Both the differential inverter 804 and the differential inverter 806 have a positive input, a negative input, a positive output, and a negative output. The differential inverter 804 is oriented in FIG. 8 such that its inputs are to the left, and such that its positive input is the upper of the two inputs and its negative input is the lower of the two inputs. Its outputs are on the right, and its negative output is the upper of the two outputs and its positive output is the lower of its two outputs. The differential inverter 806 is oriented in FIG. 8 such that its inputs are to the right, and such that its negative input is the upper of the two inputs and its positive input is the lower of the two inputs. Its outputs are on the left, and its positive output is the upper of the two outputs and its negative output is the lower of its two outputs.

The negative output of the differential inverter 804 is coupled to the negative input of the differential inverter 806 by a connection that carries a signal 821. The positive output of the differential inverter 806 is coupled to the positive input of the differential inverter 804 by a connection that carries a signal 822. The positive output of the differential inverter 804 is coupled to the positive input of the differential inverter 806 by a connection that carries a signal 823. And the negative output of the differential inverter 806 is coupled to the negative input of the differential inverter 806 by a connection that carries a signal 824.

The differential inverter 804 has (i) an injection-pulse input port 831 that is configured to receive an injection-pulse signal 871 for injection locking the signal 822 and (ii) an injection-pulse input port 833 that is configured to receive an injection-pulse signal 873 for injection locking the signal 824. The differential inverter 806 has (i) an injection-pulse input port 832 that is configured to receive an injection-pulse signal 872 for injection locking the signal 822 and (ii) an injection-pulse input port 833 that is configured to receive an injection-pulse signal 873 for injection locking the signal 824. The differential inverter 806 has an injection-pulse input port 832 that is configured to receive an injection-pulse signal 872 for injection locking the signal 8. The differential inverter 804 has an injection-pulse input 831 that is configured to receive an injection-pulse signal 871 and that pertains to injection locking the signal 822. The differential inverter 804 has an injection-pulse input 831 that is configured to receive an injection-pulse signal 871 and that pertains to injection locking the signal 822.

Figure 9:
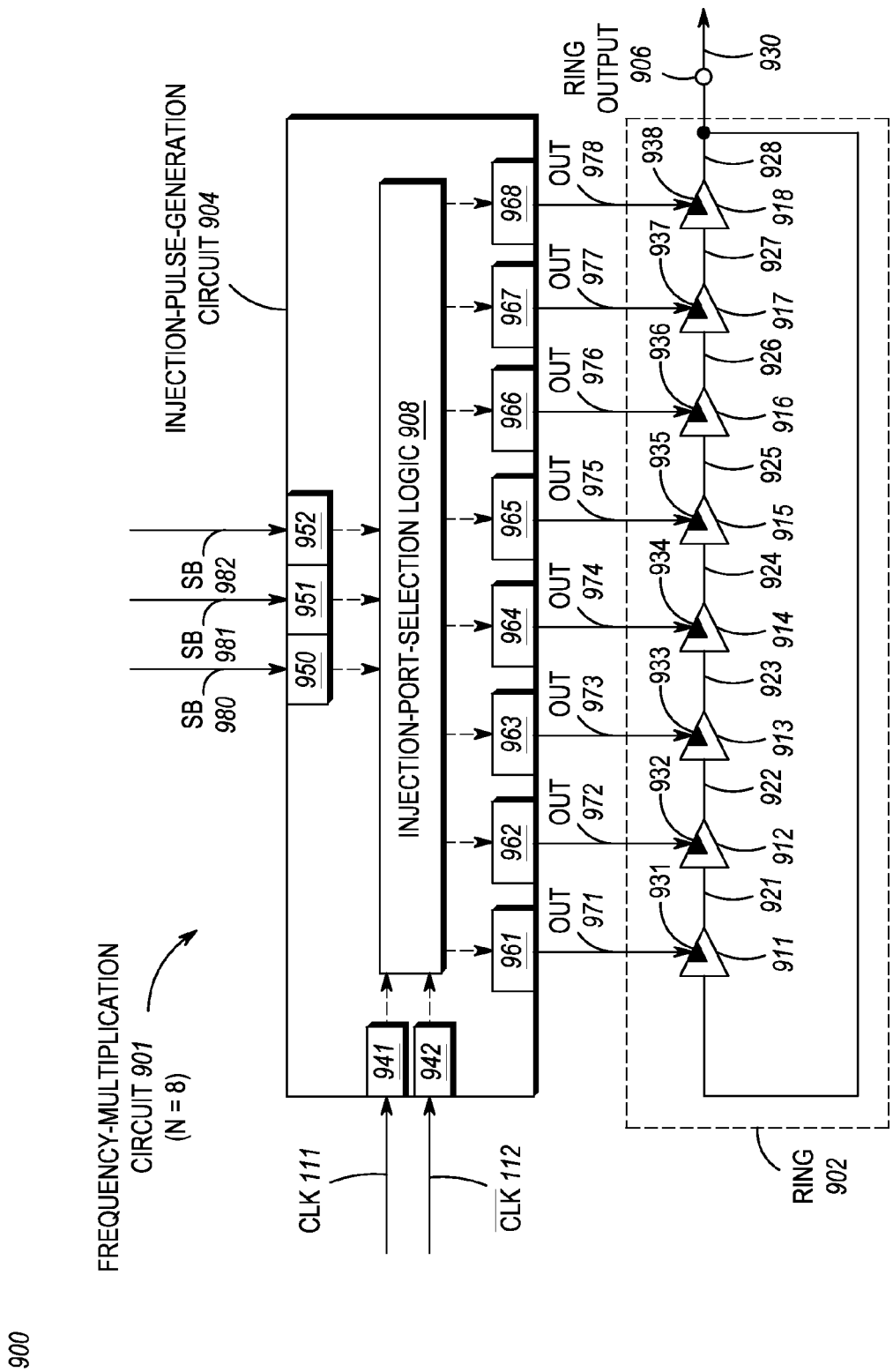
FIG. 9 depicts a second example frequency-multiplication circuit, in accordance with at least one embodiment.

FIG. 9 is a diagram 900 that depicts an example frequency-multiplication circuit 901, in accordance with at least one embodiment. As is the case with the above-described FIG. 8, the reference numerals in FIG. 9, and indeed throughout the figure set that is part of this disclosure, have been chosen where possible to be consistent with other figures in the figure set, in order to be more readily understood. It is noted at the outset of this description of FIG. 9 that one salient difference between the frequency-multiplication circuit 901 of FIG. 9 and the frequency-multiplication circuit 106 of FIGS. 1 and 2 is that N equals 8 for the former whereas N equals 4 for the latter. And other differences will be evident from the below description. As described below, the frequency-multiplication circuit 901 includes a ring 902, an injection-pulse-generation circuit 904, and a ring output port 906 at which is present a ring output signal 930.

The ring 902 is a ring of eight delay-buffer elements 911-918, each of which provides an equal amount of time delay D; in particular, as is the case with each of the delay-buffer elements 211-214 of FIG. 2, each of the delay-buffer elements 911-918 provides a delay equal to one unit of time. In the orientation of the example that is depicted in FIG. 9, each of the delay-buffer elements 911-918 has an input on its respective left side and an output on its respective right side. Each of the delay-buffer elements 911-918 has a respective injection-pulse input port 931-938 that is configured to receive a respective injection-pulse output signal 971-978 via a respective injection-pulse output port 961-968 of the injection-pulse-generation circuit 904.

A signal 921 is present at the output of the delay-buffer element 911 and at the input of the delay-buffer element 912. A signal 922 is present at the output of the delay-buffer element 912 and at the input of the delay-buffer element 913. A signal 923 is present at the output of the delay-buffer element 913 and at the input of the delay-buffer element 914. A signal 924 is present at the output of the delay-buffer element 914 and at the input of the delay-buffer element 915. A signal 925 is present at the output of the delay-buffer element 915 and at the input of the delay-buffer element 916. A signal 926 is present at the output of the delay-buffer element 916 and at the input of the delay-buffer element 917. A signal 927 is present at the output of the delay-buffer element 917 and at the input of the delay-buffer element 918. A signal 928 is present at the output of the delay-buffer element 918 and at the input of the delay-buffer element 911. The signal 928 is also the output signal 930 that is present at the output port 906.

The injection pulse-generation circuit 904 includes a clock input port 941 that is configured to receive the clock signal 111, and also includes an inverse-clock input port 942 that is configured to receive the inverse clock signal 112. Also, the injection-pulse-generation circuit 904 includes a pulse-selection input port 950/951/952 that is configured to receive pulse-selection control signals that are represented as SBs 980, 981, and 982. The injection-pulse-generation circuit 904 further includes a balanced-delay selection-logic circuit that is referred to herein as the injection-port-selection logic 908, which is connected to the clock input port 941, the inverse-clock input port 942, the pulse-selection input port 950/951/952, and the injection-pulse output ports 961-968. The injection-pulse-generation circuit 904 applies the injection-port-selection logic 908 to the clock signal 111 and to the inverse clock signal 112 according to the SBs 980/981/982. The following Examples C and D make use of the circuit of FIG. 9.

FIG. 10 depicts an example time-sequenced state table 1000 in accordance with the above-mentioned Example C, which as mentioned above involves use of the example frequency-multiplication circuit 901 of FIG. 9, in accordance with at least one embodiment. The table 1000 is similar in some ways to the state tables 300 and 500 that are described above, and thus is not described in as much detail. One difference between the table 1000 and either of the tables 300 or 500 is that the table 1000 includes an extra column due to the presence of three SBs as opposed to two SBs.

In addition to the header row, the table 1000 includes eight data rows that correspond respectively to example times t=1011, t=1022, t=1033, t=1044, t=1055, t=1066, t=1077, and t=1088. The time t=1011 is associated with SBs 920C/921C/922C having the value 000, the rising-edge input being the clock signal 911C, the rising-edge output signal being 978C, the falling-edge input being the inverse clock signal 912C, and the falling-edge output signal being 974C. The time t=1022 is associated with SBs 920C/921C/922C having the value 100, the rising-edge input being the inverse clock signal 912C, the rising-edge output signal being 973C, the falling-edge input being the clock signal 911C, and the falling-edge output signal being 977C.

The time t=1033 is associated with SBs 920C/921C/922C having the value 010, the rising-edge input being the clock signal 911C, the rising-edge output signal being 976C, the falling-edge input being the inverse clock signal 912C, and the falling-edge output signal being 972C. The time t=1044 is associated with SBs 920C/921C/922C having the value 110, the rising-edge input being the inverse clock signal 912C, the rising-edge output signal being 971C, the falling-edge input being the clock signal 911C, and the falling-edge output signal being 975C.

The time t=1055 is associated with SBs 920C/921C/922C having the value 001, the rising-edge input being the clock signal 911C, the rising-edge output signal being 974C, the falling-edge input being the inverse clock signal 912C, and the falling-edge output signal being 978C. The time t=1066 is associated with SBs 920C/921C/922C having the value 101, the rising-edge input being the inverse clock signal 912C, the rising-edge output signal being 977C, the falling-edge input being the clock signal 911C, and the falling-edge output signal being 973C.

The time t=1077 is associated with SBs 920C/921C/922C having the value 011, the rising-edge input being the clock signal 911C, the rising-edge output signal being 972C, the falling-edge input being the inverse clock signal 912C, and the falling-edge output signal being 976C. The time t=1088 is associated with SBs 920C/921C/922C having the value 111, the rising-edge input being the inverse clock signal 912C, the rising-edge output signal being 975C, the falling-edge input being the clock signal 911C, and the falling-edge output signal being 971C.

The below description of FIG. 11 demonstrates that the data in the table 1000 corresponds at each of the example time instances with (i) a rising-edge injection pulse being delivered to the particular one of the signals 921C-928C that has a co-occurring rising edge and (ii) a falling-edge injection pulse being delivered to the particular one of the signals 921C-928C that has a co-occurring falling edge.

Figure 11:
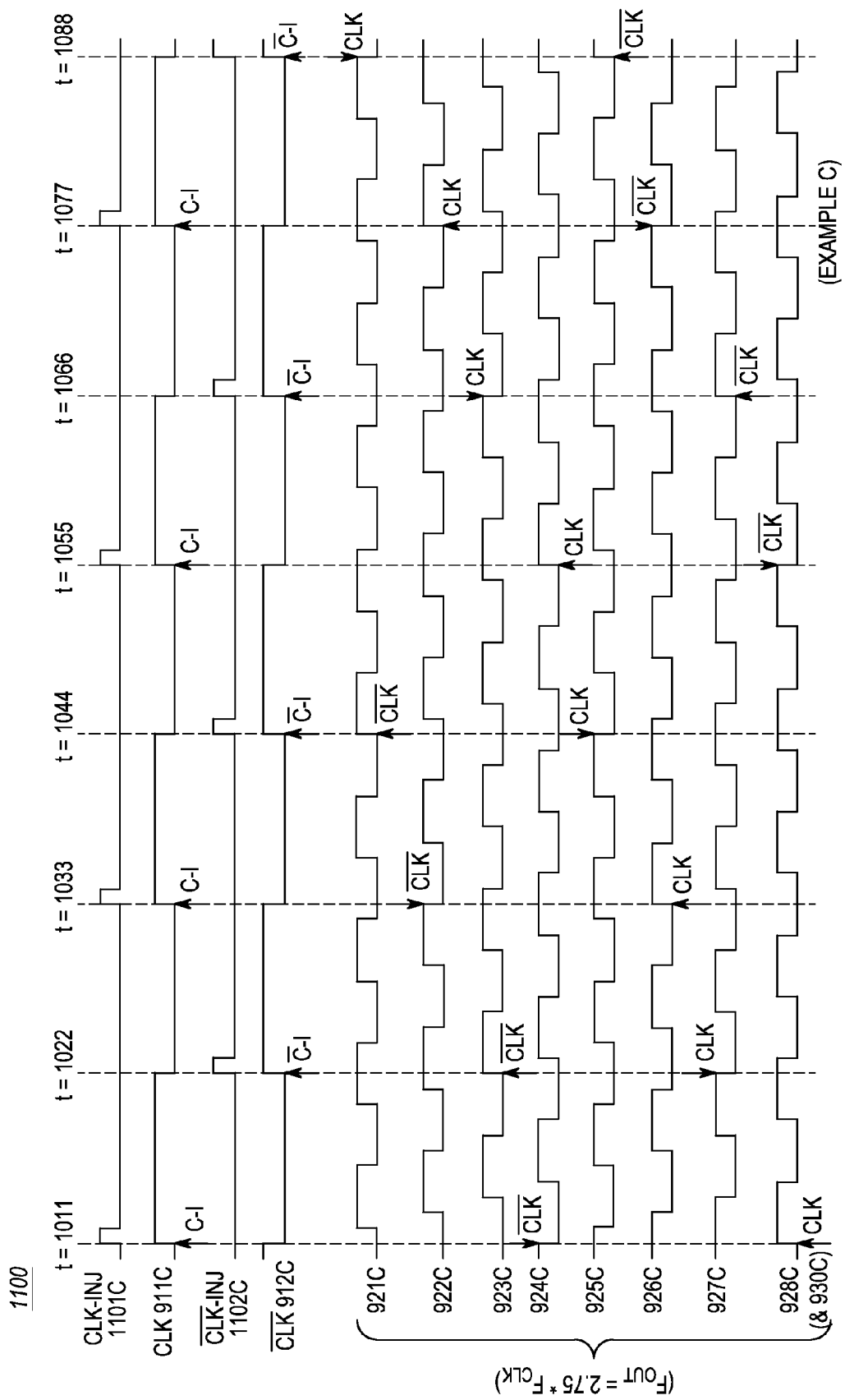
FIG. 11 depicts a third example timing diagram, which corresponds to the third example time-sequenced state table of FIG. 10, in accordance with at least one embodiment.

FIG. 11 also pertains to Example C, and depicts an example timing diagram 1100 that corresponds to the example time-sequenced state table 1000 of FIG. 10, in accordance with at least one embodiment. FIG. 11 shows that a clock-injection signal 1101C uses rising-edge injection pulses to injection lock the clock signal 911C, and that an inverse-injection-clock signal 1102C uses rising-edge injection pulses to injection lock the inverse clock signal 912C. Each of those four signals has a period ($T_{CLK}$) of 22 and a corresponding frequency ($F_{CLK}$) of 1/22. Each of the signals 921C-928C (where the signal 928C is also the ring output signal 930C that is present at the ring output port 906C) has a period ($T_{OUT}$) of 8 and a corresponding frequency ($F_{OUT}$) of 1/8. Thus, Example C is another demonstration that $F_{OUT}$ bears the same proportional relationship (2.75:1 in this example) that $T_{CLK}$ (i.e., 22) bears to (N*D) (i.e., 8*1).

The signal 921C receives a falling-edge clock injection pulse at t=1088, and also receives a rising-edge inverse-clock injection pulse at t=1044. The signal 922C receives a falling-edge inverse-clock injection pulse at t=1033, and also receives a rising-edge clock injection pulse at t=1077. The signal 923C receives a falling-edge clock injection pulse at t=1066, and also receives a rising-edge inverse-clock injection pulse at t=1022. The signal 924C receives a falling-edge inverse-clock injection pulse at t=1011, and also receives a rising-edge clock injection pulse at t=1055. The signal 925C receives a falling-edge clock injection pulse at t=1044, and also receives a rising-edge inverse-clock injection pulse at t=1088. The signal 926C receives a falling-edge inverse-clock injection pulse at t=1077, and also receives a rising-edge clock injection pulse at t=1033. The signal 927C receives a falling-edge clock injection pulse at t=1022, and also receives a rising-edge inverse-clock injection pulse at t=1066. The signal 928C receives a falling-edge inverse-clock injection pulse at t=1055, and also receives a rising-edge clock injection pulse at t=1011.

FIG. 12 depicts an example time-sequenced state table 1200 in accordance with the above-mentioned Example D, which as mentioned above involves use of the example frequency-multiplication circuit 901 of FIG. 9, in accordance with at least one embodiment. The table 1200 is similar in some ways to the state table 1000, and thus is not described in as much detail.

In addition to the header row, the table 1200 includes eight data rows that correspond to example times t=1207, t=1214, t=1221, t=1228, t=1235, t=1242, t=1249, and t=1256. The time t=1207 is associated with SBs 920D/921D/922D having the value 000, the rising-edge input being the clock signal 911D, the rising-edge output signal being 978D, the falling-edge input being the inverse clock signal 912D, and the falling-edge output signal being 974D. The time t=1214 is associated with SBs 920D/921D/922D having the value 100, the rising-edge input being the inverse clock signal 912D, the rising-edge output signal being 977D, the falling-edge input being the clock signal 911D, and the falling-edge output signal being 973D.

The time t=1221 is associated with SBs 920D/921D/922D having the value 010, the rising-edge input being the clock signal 911D, the rising-edge output signal being 976D, the falling-edge input being the inverse clock signal 912D, and the falling-edge output signal being 972D. The time t=1228 is associated with SBs 920D/921D/922D having the value 110, the rising-edge input being the inverse clock signal 912D, the rising-edge output signal being 975D, the falling-edge input being the clock signal 911D, and the falling-edge output signal being 971D.

The time t=1235 is associated with SBs 920D/921D/922D having the value 001, the rising-edge input being the clock signal 911D, the rising-edge output signal being 974D, the falling-edge input being the inverse clock signal 912D, and the falling-edge output signal being 978D. The time t=1242 is associated with SBs 920D/921D/922D having the value 101, the rising-edge input being the inverse clock signal 912D, the rising-edge output signal being 973D, the falling-edge input being the clock signal 911D, and the falling-edge output signal being 977D.

The time t=1249 is associated with SBs 920D/921D/922D having the value 011, the rising-edge input being the clock signal 911D, the rising-edge output signal being 972D, the falling-edge input being the inverse clock signal 912D, and the falling-edge output signal being 976D. The time t=1256 is associated with SBs 920D/921D/922D having the value 111, the rising-edge input being the inverse clock signal 912D, the rising-edge output signal being 971D, the falling-edge input being the clock signal 911D, and the falling-edge output signal being 975D.

The below description of FIG. 13 demonstrates that the data in the table 1200 corresponds at each of the example time instances with (i) a rising-edge injection pulse being delivered to the particular one of the signals 921D-928D that has a co-occurring rising edge and (ii) a falling-edge injection pulse being delivered to the particular one of the signals 921D-928D that has a co-occurring falling edge.

Figure 13:
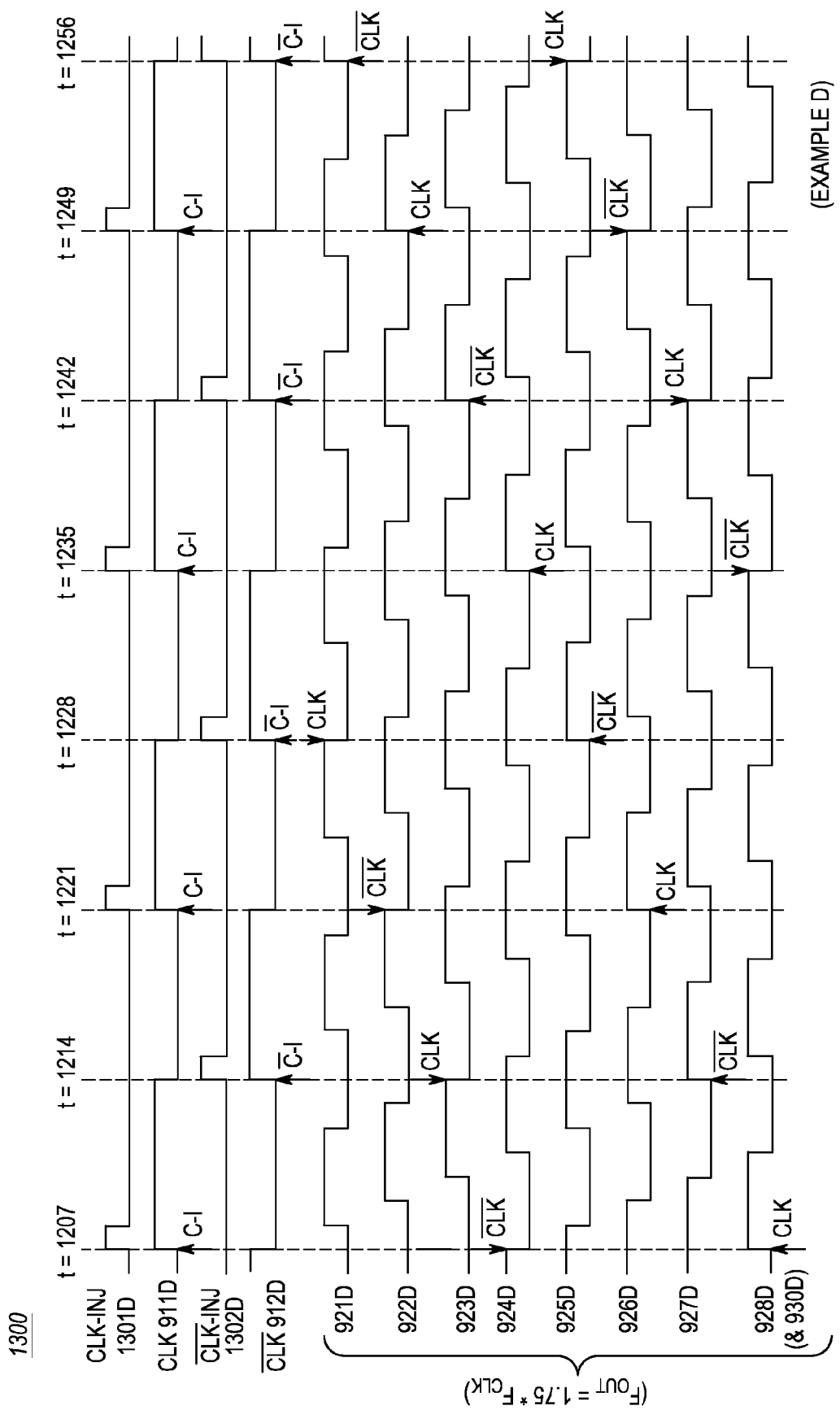
FIG. 13 depicts a fourth example timing diagram, which corresponds to the fourth example time-sequenced state table of FIG. 12, in accordance with at least one embodiment.

FIG. 13 also pertains to Example D, and depicts an example timing diagram 1300 that corresponds to the example time-sequenced state table 1200 of FIG. 12, in accordance with at least one embodiment. FIG. 13 shows that a clock-injection signal 1301D uses rising-edge injection pulses to injection lock the clock signal 911D, and that an inverse-injection-clock signal 1302D uses rising-edge injection pulses to injection lock the inverse clock signal 912D. Each of those four signals has a period ($T_{CLK}$) of 14 and a corresponding frequency ($F_{CLK}$) of 1/14. Each of the signals 921D-928D (where the signal 928D is also the ring output signal 930D that is present at the ring output port 906D) has a period ($T_{OUT}$) of 8 and a corresponding frequency ($F_{OUT}$) of 1/8. Thus, Example D is another demonstration that $F_{OUT}$ bears the same proportional relationship (1.75:1 in this example) that $T_{CLK}$ (i.e., 14) bears to (N*D) (i.e., 8*1).

The signal 921D receives a falling-edge clock injection pulse at t=1228, and also receives a rising-edge inverse-clock injection pulse at t=1256. The signal 922D receives a falling-edge inverse-clock injection pulse at t=1221, and also receives a rising-edge clock injection pulse at t=1249. The signal 923D receives a falling-edge clock injection pulse at t=1214, and also receives a rising-edge inverse-clock injection pulse at t=1242. The signal 924D receives a falling-edge inverse-clock injection pulse at t=1207, and also receives a rising-edge clock injection pulse at t=1235. The signal 925D receives a falling-edge clock injection pulse at t=1256, and also receives a rising-edge inverse-clock injection pulse at t=1228. The signal 926D receives a falling-edge inverse-clock injection pulse at t=1249, and also receives a rising-edge clock injection pulse at t=1221. The signal 927D receives a falling-edge clock injection pulse at t=1242, and also receives a rising-edge inverse-clock injection pulse at t=1214. The signal 928D receives a falling-edge inverse-clock injection pulse at t=1235, and also receives a rising-edge clock injection pulse at t=1207.

Figure 14:
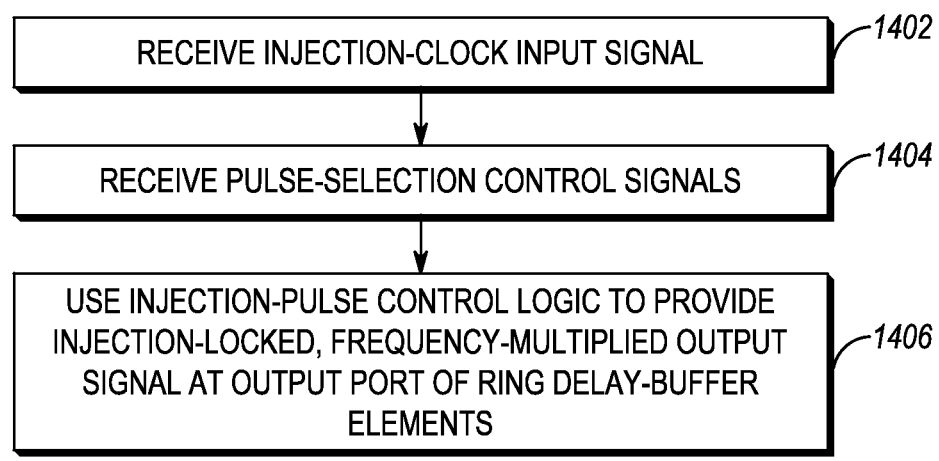
FIG. 14 depicts an example process that may be carried out by a frequency-multiplication circuit, in accordance with at least one embodiment.

FIG. 14 depicts an example process 1400 that may be carried out by a circuit system that includes a ring of a number (N) of serially connected delay-buffer elements that each provide an equal time delay (D), where at least some of the delay-buffer elements have at least one pulse-locking injection port, and where the ring has a ring output port, in accordance with at least one embodiment. At step 1402, the circuit system receives a clock signal having a clock-signal frequency ($F_{CLK}$) and a corresponding clock-signal period ($T_{CLK}$). At step 1404, the circuit system receives pulse-selection control signals, and generates balanced-delay injection-pulse signals by applying balanced-delay selection-logic circuitry to the clock signal according to the pulse-selection control signals. At step 1406, the circuit system provides an injection-locked, frequency-multiplied output signal at the ring output port by transmitting the generated balanced-delay injection-pulse signals to respective ones of the pulse-locking injection ports, where the output signal has an output-signal frequency ($F_{OUT}$) that equals the reciprocal of (N*D) and that bears the same proportional relationship to $F_{CLK}$ that $T_{CLK}$ bears to (N*D).

Figure 15:
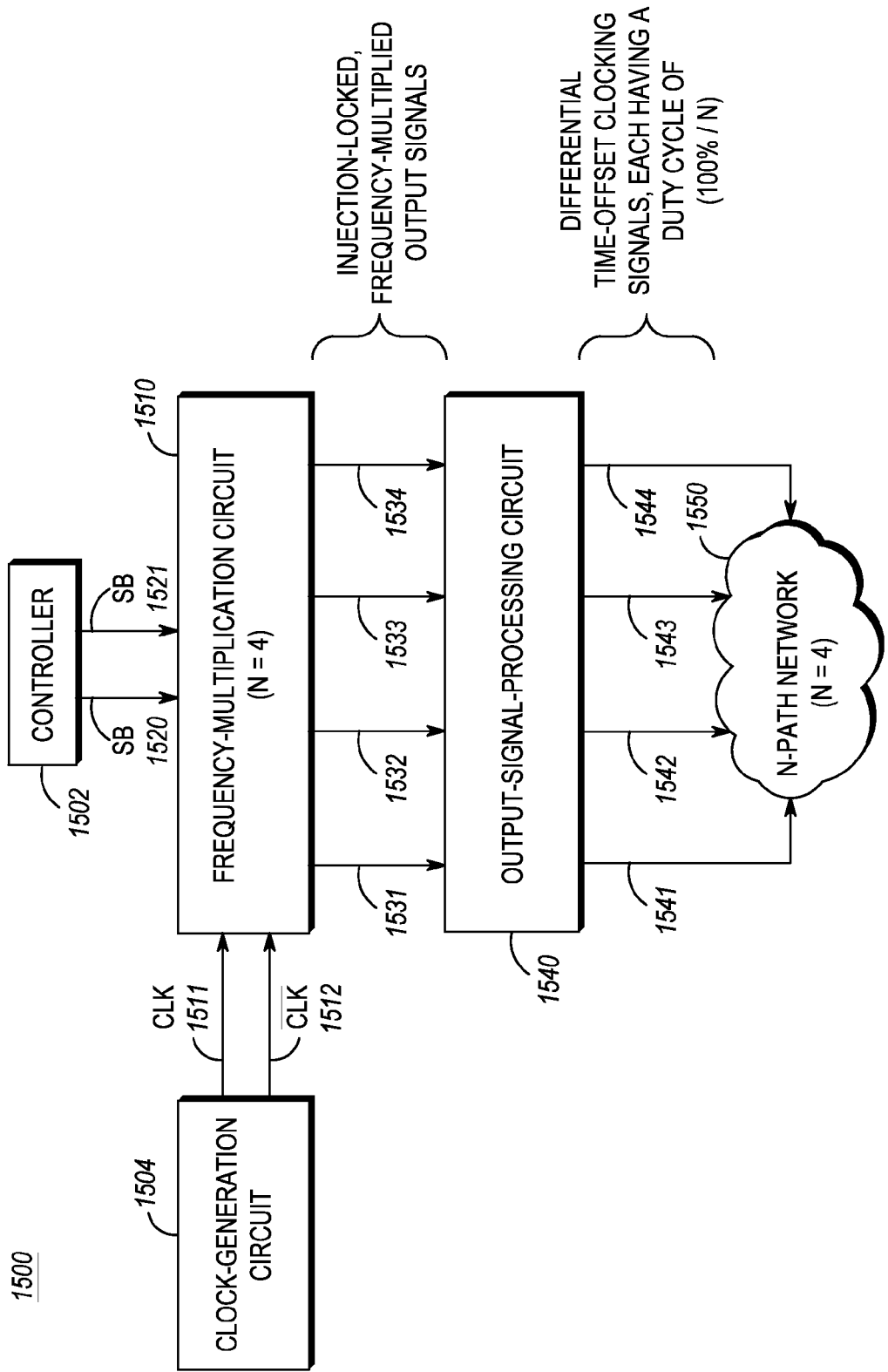
FIG. 15 depicts a second example circuit system, which includes a third example frequency-multiplication circuit and an example output-signal-processing circuit, in accordance with at least one embodiment.

FIG. 15 depicts an example circuit system 1500 that includes an example frequency-multiplication circuit 1510 (for which N=4) and an example output-signal-processing circuit 1540, in accordance with at least one embodiment. The example circuit system 1500 also includes a controller 1502, a clock-generation circuit 1504, and an N-path network 1550. The controller 1502 outputs pulse-selection control signals—represented as two SBs 1520 and 1521—to the frequency-multiplication circuit 1510. The clock-generation circuit 1504 outputs a clock signal 1511 and an inverse clock signal 1512 to the frequency-multiplication circuit 1510, which outputs injection-locked, frequency-multiplied output signals 1531-1534 to the output-signal-processing circuit 1540, which in turn outputs differential time-offset clocking signals 1541-1544 to the N-path network 1550. Each of the differential time-offset clocking signals 1541-1544 has a duty cycle equal to $$\frac{100\%}{N}$$

(i.e., 25% in this example). Further aspects of the circuit system 1500, including further aspects of the example frequency-multiplication circuit 1510 and the example output-signal-processing circuit 1540, are described below in connection with FIGS. 16-21.

Figure 16:
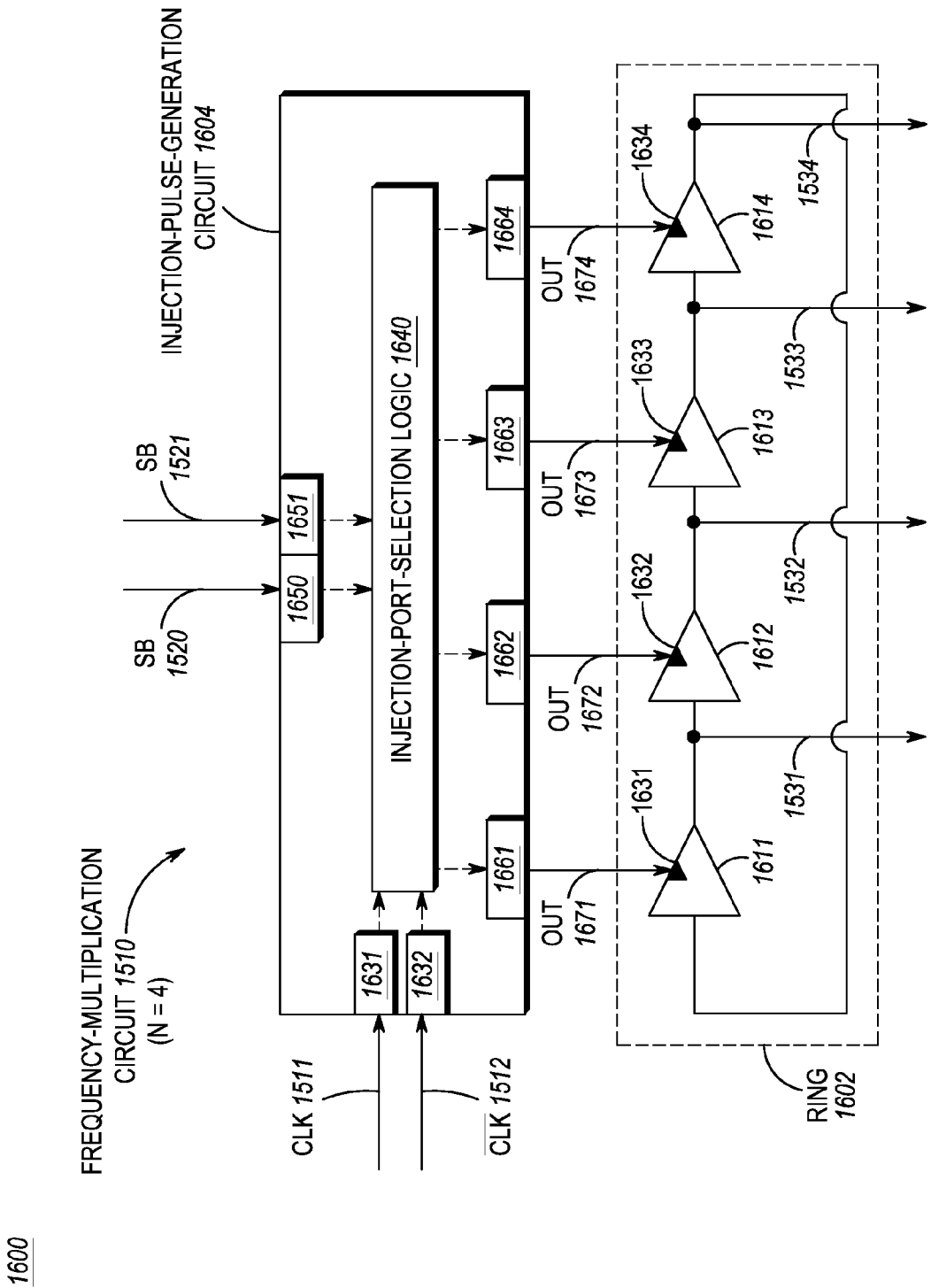
FIG. 16 depicts the third example frequency-multiplication circuit of FIG. 15, in accordance with at least one embodiment.

FIG. 16 is a diagram 1600 depicts the example frequency-multiplication circuit 1510 of FIG. 15, in accordance with at least one embodiment. It can be seen in the embodiment that is depicted in FIG. 16 that the frequency-multiplication circuit 1510 (for which N=4) includes a ring 1602 and an injection-pulse-generation circuit 1604. The example frequency-multiplication circuit 1510 of FIGS. 15 and 16 is similar in a number of ways to the example frequency-multiplication circuit 106 of FIGS. 1 and 2, and thus is not described in as great of detail.

One salient difference between the two example frequency-multiplication circuits is that, while the frequency-multiplication circuit 106 has a ring output port 206 at which a ring output signal 130 is present, the frequency-multiplication circuit 1510 has four output signals 1531-1534. The output signal 1531 is present at the output of the delay-buffer element 1611 and at the input of the delay-buffer element 1612. The output signal 1532 is present at the output of the delay-buffer element 1612 and at the input of the delay-buffer element 1613. The output signal 1533 is present at the output of the delay-buffer element 1613 and at the input of the delay-buffer element 1614. The output signal 1534 is present at the output of the delay-buffer element 1614 and at the input of the delay-buffer element 1611.

Figure 17:
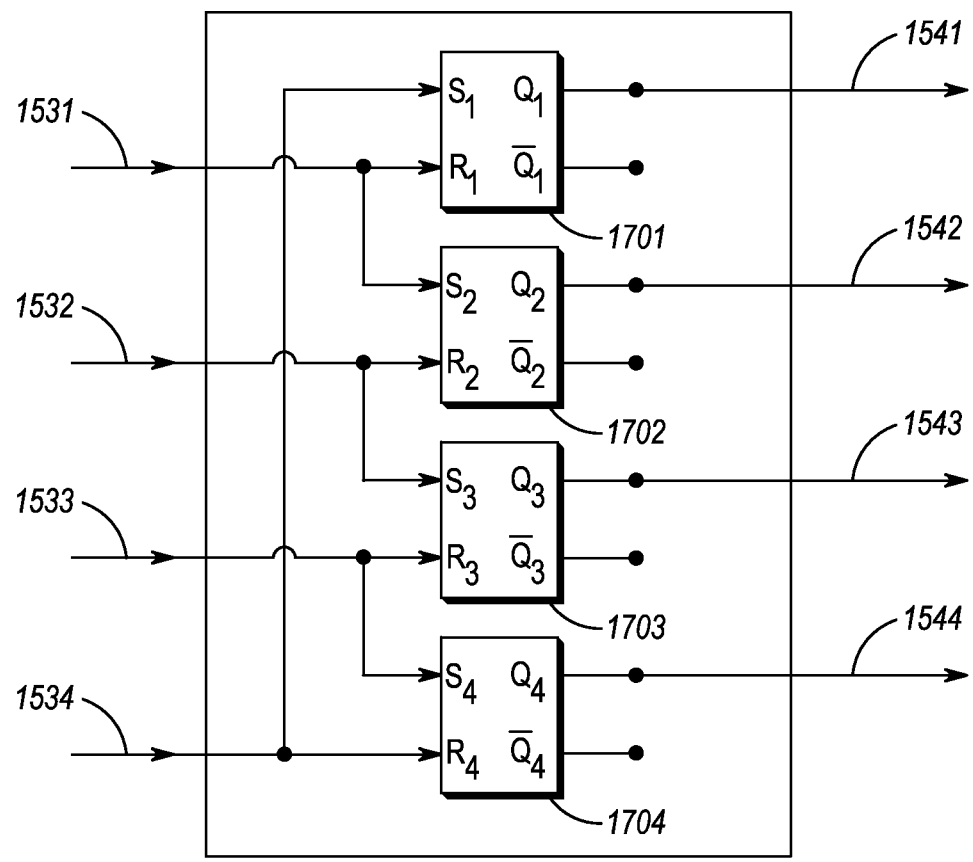
FIG. 17 depicts the example output-signal-processing circuit of FIG. 15, in accordance with at least one embodiment.

FIG. 17 is a diagram 1700 of depicts the example output-signal-processing circuit 1540, in accordance with at least one embodiment. In the embodiment that is depicted in FIG. 17, the output-signal-processing circuit 1540 (i) receives as inputs the four signals 1531-1534 from the frequency-multiplication circuit 1510 and (ii) outputs the signals 1541-1544 to the N-path network 1550.

The output-signal-processing circuit 1540 includes four of what are known in the art as "set-reset (SR) latches" 1701-1704. The SR latch 1701 takes the signal 1534 as its S input, takes the signal 1531 as its R input, and outputs the signal 1541 as its Q output. The SR latch 1702 takes the signal 1531 as its S input, takes the signal 1532 as its R input, and outputs the signal 1542 as its Q output. The SR latch 1703 takes the signal 1532 as its S input, takes the signal 1533 as its R input, and outputs the signal 1543 as its Q output. The SR latch 1704 takes the signal 1533 as its S input, takes the signal 1534 as its R input, and outputs the signal 1544 as its Q output.

FIG. 18 depicts an example time-sequenced state table 1800 in accordance with an Example E, which involves use of the example frequency-multiplication circuit 1510 of FIG. 15, in accordance with at least one embodiment. The table 1800 is similar in some ways to the other state tables that are described above, and thus is not described in as much detail. In addition to the header row, the table 1800 includes seven data rows that correspond respectively to example times t=1805, t=1810, t=1815, t=1820, t=1825, t=1830, and t=1835. The time t=1805 is associated with SBs 1520E and 1521E having the value 00, the rising-edge input being the clock signal 1511E, the rising-edge output signal being 1674E, the falling-edge input being the inverse clock signal 1512E, and the falling-edge output signal being 1672E.

The time t=1810 is associated with SBs 1520E and 1521E having the value 10, the rising-edge input being the inverse clock signal 1512E, the rising-edge output signal being 1671E, the falling-edge input being the clock signal 1511E, and the falling-edge output signal being 1673E. The time t=1815 is associated with SBs 1520E and 1521E having the value 01, the rising-edge input being the clock signal 1511E, the rising-edge output signal being 1672E, the falling-edge input being the inverse clock signal 1512E, and the falling-edge output signal being 1674E.

The time t=1820 is associated with SBs 1520E and 1521E having the value 11, the rising-edge input being the inverse clock signal 1512E, the rising-edge output signal being 1673E, the falling-edge input being the clock signal 1511E, and the falling-edge output signal being 1671E. The time t=1825 is associated with SBs 1520E and 1521E having the value 00, the rising-edge input being the clock signal 1511E, the rising-edge output signal being 1674E, the falling-edge input being the inverse clock signal 1512E, and the falling-edge output signal being 1672E.

The time t=1830 is associated with SBs 1520E and 1521E having the value 10, the rising-edge input being the inverse clock signal 1512E, the rising-edge output signal being 1671E, the falling-edge input being the clock signal 1511E, and the falling-edge output signal being 1673E. The time t=1835 is associated with SBs 1520E and 1521E having the value 01, the rising-edge input being the clock signal 1511E, the rising-edge output signal being 1672E, the falling-edge input being the inverse clock signal 1512E, and the falling-edge output signal being 1674E.

The below description of FIG. 19 demonstrates that the data in the table 1800 corresponds at each of the example time instances with (i) a rising-edge injection pulse being delivered to the particular one of the signals 1531E-1534E that has a co-occurring rising edge and (ii) a falling-edge injection pulse being delivered to the particular one of the signals 1531E-1534E that has a co-occurring falling edge.

Figure 19:
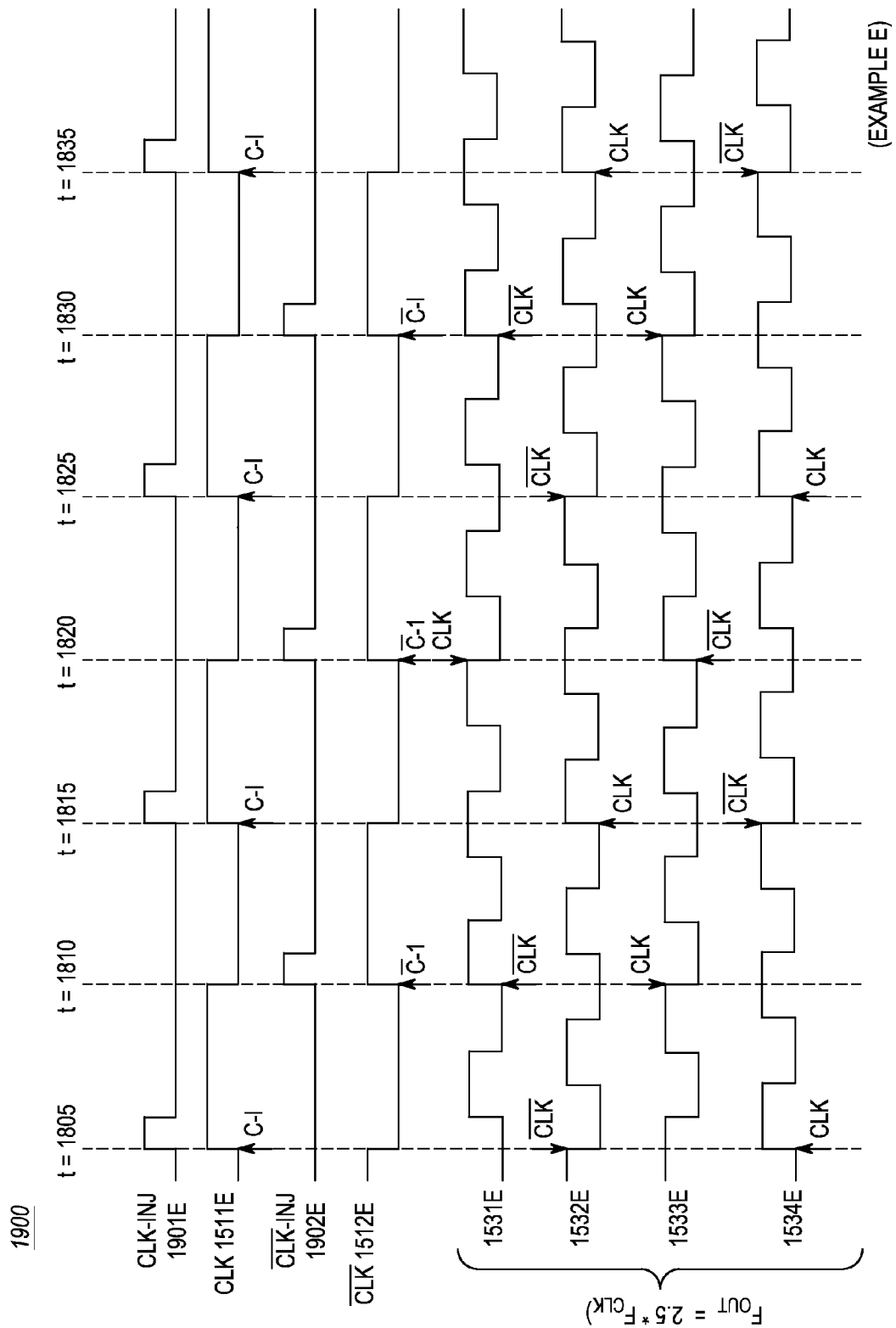
FIG. 19 depicts a fifth example timing diagram, which corresponds to the fifth example time-sequenced state table of FIG. 18, in accordance with at least one embodiment.

FIG. 19 also pertains to Example E, and depicts an example timing diagram 1900 that corresponds to the example time-sequenced state table 1800 of FIG. 18, in accordance with at least one embodiment. FIG. 19 shows that a clock-injection signal 1901E uses rising-edge injection pulses to injection lock the clock signal 1511E, and that an inverse-injection-clock signal 1902E uses rising-edge injection pulses to injection lock the inverse clock signal 1512E. Each of those four signals has a period ($T_{CLK}$) of 10 and a corresponding frequency ($F_{CLK}$) of 1/10. Each of the signals 1531E-1534E has a period ($T_{OUT}$) of 4 and a corresponding frequency ($F_{OUT}$) of 1/4. Thus, Example E is another demonstration that $F_{OUT}$ bears the same proportional relationship (2.5:1 in this example) that $T_{CLK}$ (i.e., 10) bears to (N*D) (i.e., 4*1).

The signal 1531E receives a falling-edge clock injection pulse at t=1820, and also receives rising-edge inverse-clock injection pulses at t=1810 and t=1830. The signal 1532E receives falling-edge inverse-clock injection pulses at t=1805 and t=1825, and also receives rising-edge clock injection pulses at t=1815 and t=1835. The signal 1533E receives falling-edge clock injection pulses at t=1810 and t=1830, and also receives a rising-edge inverse-clock injection pulse at t=1820. The signal 1534E receives falling-edge inverse-clock injection pulses at t=1815 and t=1835, and also receives rising-edge clock injection pulses at t=1805 and t=1825.

Figure 20:
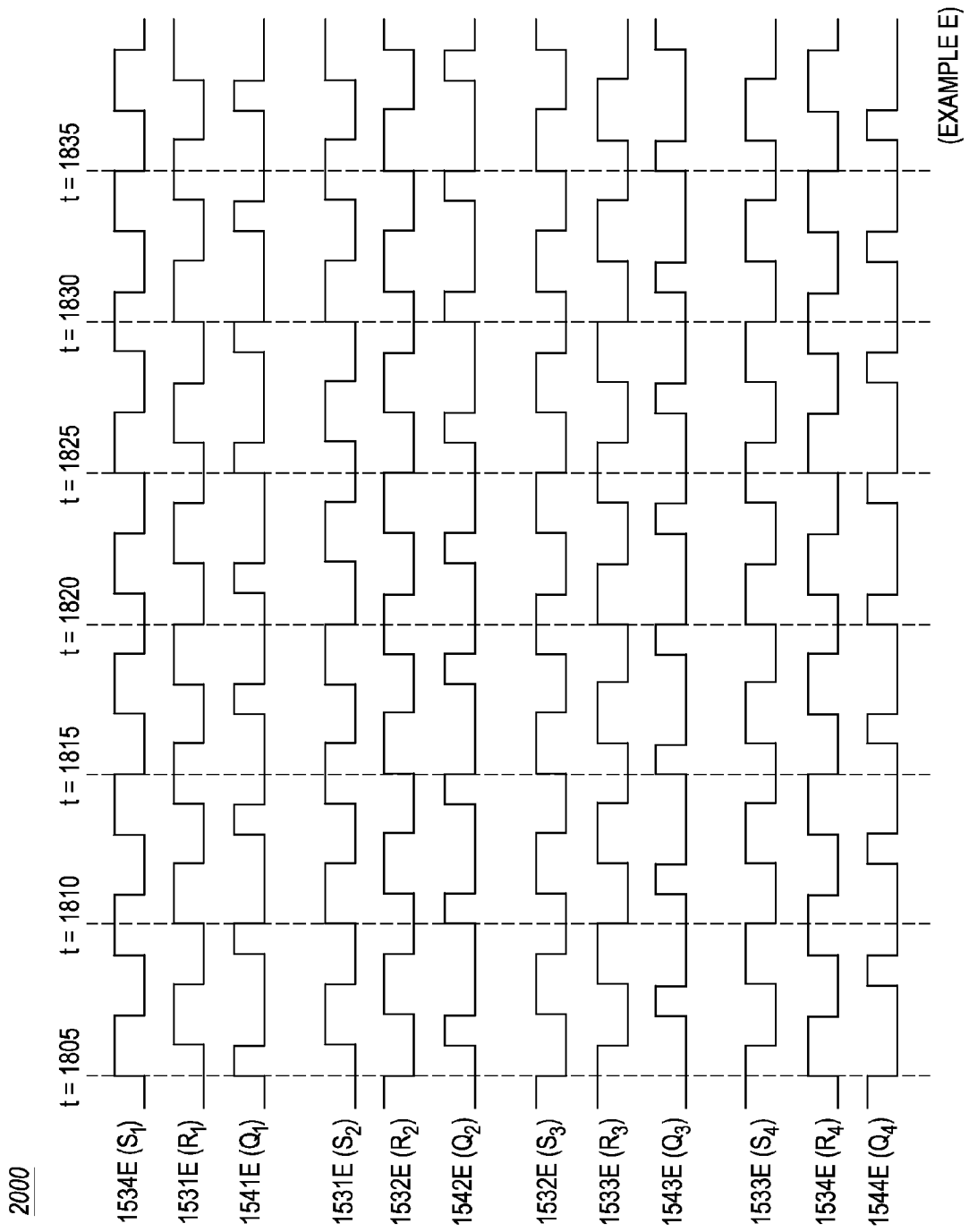
FIG. 20 depicts a sixth example timing diagram, which corresponds to an example input-output behavior of the example output-signal-processing circuit of FIG. 15 in the context of the fifth example scenario, in accordance with at least one embodiment.

FIG. 20 depicts a timing diagram 2000, which corresponds to an example input-output behavior of the example output-signal-processing circuit 1540 of FIG. 15 in the context of Example E, in accordance with at least one embodiment. In particular, FIG. 20 shows the respect input/output behaviors of each of the four SR latches 1701-1704 of FIG. 17.

The first group of three signals at the top of the timing diagram 2000 pertains to the SR latch 1701. The S input is the signal 1534E that is also depicted in FIG. 19. The R input is the signal 1531E that is also depicted in FIG. 19. The Q output is the signal 1541E, and it can be seen that the signal 1541E has a period of 4 and a corresponding frequency of 1/4, and further that the signal 1541E has a duty cycle of 25%, which is equal to 100% divided by N (i.e., 4).

The second group of three signals from the top of the timing diagram 2000 pertains to the SR latch 1702. The S input is the signal 1531E that is also depicted in FIG. 19. The R input is the signal 1532E that is also depicted in FIG. 19. The Q output is the signal 1542E, and it can be seen that the signal 1542E also has a period of 4 and a corresponding frequency of 1/4, and further that the signal 1542E has a duty cycle of 25%, which is equal to 100% divided by N (i.e., 4). It can also be seen that the signal 1542E is shifted by 1/4 period (i.e., by 360 degrees over N) ahead of the signal 1541E.

The third group of three signals from the top of the timing diagram 2000 pertains to the SR latch 1703. The S input is the signal 1532E that is also depicted in FIG. 19. The R input is the signal 1533E that is also depicted in FIG. 19. The Q output is the signal 1543E, and it can be seen that the signal 1543E also has a period of 4 and a corresponding frequency of 1/4, and further that the signal 1543E has a duty cycle of 25%, which is equal to 100% divided by N (i.e., 4). It can also be seen that the signal 1543E is shifted by 1/4 period (i.e., by 360 degrees over N) ahead of the signal 1542E.

The fourth group of three signals from the top of the timing diagram 2000 pertains to the SR latch 1704. The S input is the signal 1533E that is also depicted in FIG. 19. The R input is the signal 1534E that is also depicted in FIG. 19. The Q output is the signal 1544E, and it can be seen that the signal 1544E also has a period of 4 and a corresponding frequency of 1/4, and further that the signal 1544E has a duty cycle of 25%, which is equal to 100% divided by N (i.e., 4). It can also be seen that the signal 1544E is shifted by 1/4 period (i.e., by 360 degrees over N) ahead of the signal 1543E.

It is further noted that eight output signals each having a duty cycle equal to 12.5% would be obtained in embodiments in which N was equal to 8, and that sixteen output signals each having a duty cycle equal to 6.25% would be obtained in embodiments in which N was equal to 16. And certainly numerous other examples could be listed here.

Figure 21:
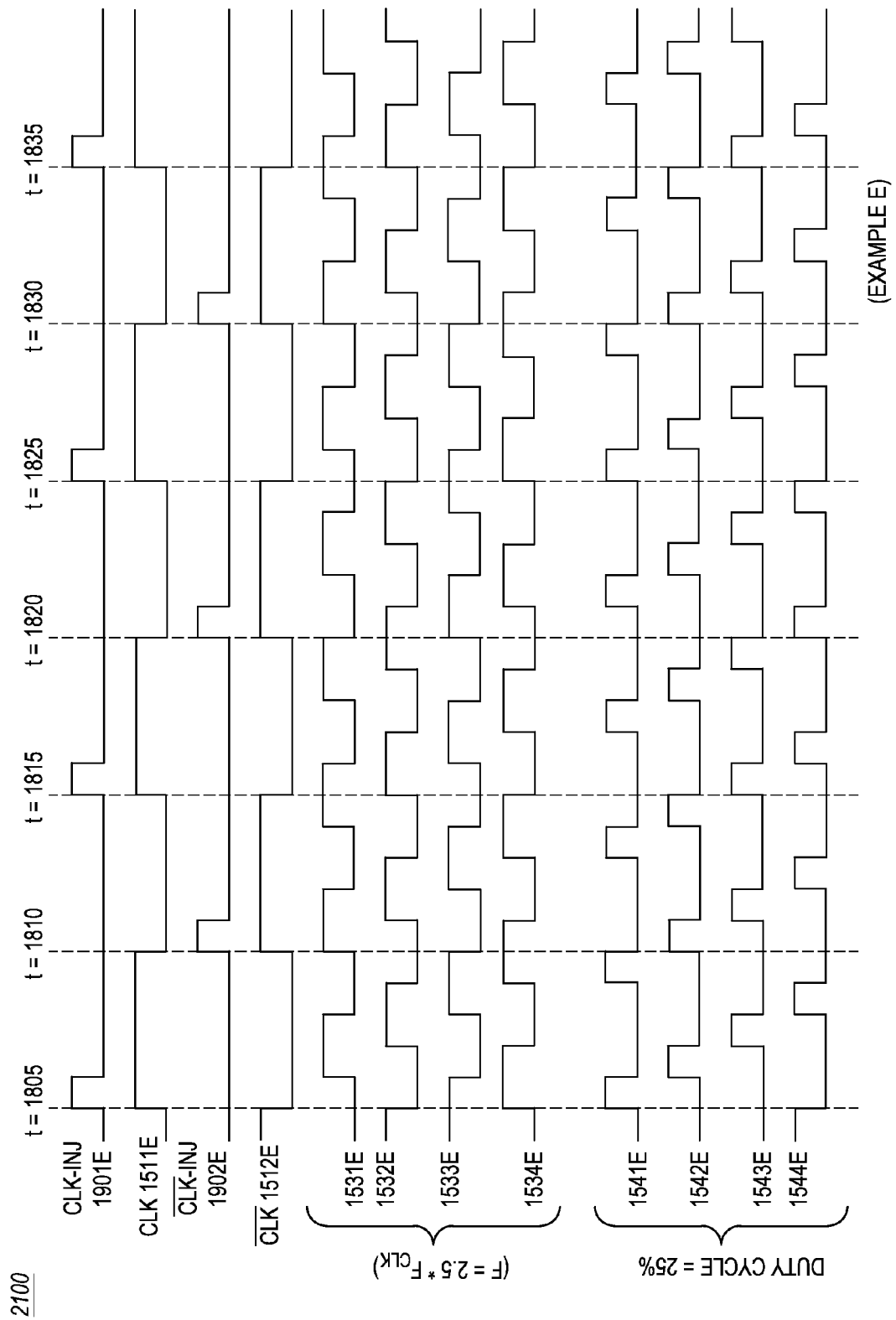
FIG. 21 depicts a seventh example timing diagram, which combines aspects of the fifth example timing diagram of FIG. 19 and the sixth example timing diagram of FIG. 20, in accordance with at least one embodiment.

FIG. 21 depicts a timing diagram 2100 that combines aspects of the timing diagram 1900 of FIG. 19 and the timing diagram 2000 of FIG. 20, in accordance with at least one embodiment. Each of the signals that is displayed on the example timing diagram 2100 is also displayed on at least one other timing diagram in this disclosure. The selection and arrangement of signals on the example timing diagram 2100 may give the reader additional insight into what is accomplished by the present systems and methods, in this particular case in the context of an implementation in which N=4, D=1, and the period of the clock signal equals 10.

Moreover, the above-described Example A, Example B, and Example E are examples in which N=4. In Examples A and E, it is the case that $F_{OUT}=2.5*F_{CLK}$. In Example B, it is the case that $F_{OUT}=3.5*F_{CLK}$. These are a few examples of frequency multipliers that can be realized using the present systems and methods in embodiments in which N=4. In such embodiments, half-integer multiples of the input frequency ($F_{CLK}$) can be obtained by selection of various different values that make up the ratio $$\frac{T_{CLK}}{(N*D)}.$$

Table 1 below gives a few more examples (for multipliers between 1.0 and 4.0, inclusive), though Table 1 is by no means exhaustive, and is provided for illustration and not by way of limitation.

TABLE 1

| N | D | (N * D) | $F_{OUT}$ | $T_{CLK}$ | $F_{CLK}$ | Multiplier |
|---|---|---------|-----------|-----------|-----------|------------|
| 4 | 1 | 4 | 1/4 | 4 | 1/4 | $F_{OUT} = 1.0 * F_{CLK}$ |
| 4 | 1 | 4 | 1/4 | 6 | 1/6 | $F_{OUT} = 1.5 * F_{CLK}$ |
| 4 | 1 | 4 | 1/4 | 8 | 1/8 | $F_{OUT} = 2.0 * F_{CLK}$ |
| 4 | 1 | 4 | 1/4 | 10 | 1/10 | $F_{OUT} = 2.5 * F_{CLK}$ |
| 4 | 1 | 4 | 1/4 | 12 | 1/12 | $F_{OUT} = 3.0 * F_{CLK}$ |
| 4 | 1 | 4 | 1/4 | 14 | 1/14 | $F_{OUT} = 3.5 * F_{CLK}$ |
| 4 | 1 | 4 | 1/4 | 16 | 1/16 | $F_{OUT} = 4.0 * F_{CLK}$ |

(N = 4)

The above-described Example C and Example D are examples in which N=8. In Example C, it is the case that $F_{OUT}=2.75*F_{CLK}$. In Example D, it is the case that $F_{OUT}=1.75*F_{CLK}$. These are a few examples of frequency multipliers that can be realized using the present systems and methods in embodiments in which N=8. In such embodiments, quarter-integer multiples of the input frequency ($F_{CLK}$) can be obtained by selection of various different values that make up the ratio $$\frac{T_{CLK}}{(N*D)}.$$

Table 2 below gives a few more examples (for multipliers between 1.00 and 4.00, inclusive), though Table 2 is by no means exhaustive, and is provided for illustration and not by way of limitation.

TABLE 2

| N | D | (N * D) | $F_{OUT}$ | $T_{CLK}$ | $F_{CLK}$ | Multiplier |
|---|---|---------|-----------|-----------|-----------|------------|
| 8 | 1 | 8 | 1/8 | 8 | 1/8 | $F_{OUT} = 1.00 * F_{CLK}$ |
| 8 | 1 | 8 | 1/8 | 10 | 1/10 | $F_{OUT} = 1.25 * F_{CLK}$ |
| 8 | 1 | 8 | 1/8 | 12 | 1/12 | $F_{OUT} = 1.50 * F_{CLK}$ |
| 8 | 1 | 8 | 1/8 | 14 | 1/14 | $F_{OUT} = 1.75 * F_{CLK}$ |
| 8 | 1 | 8 | 1/8 | 16 | 1/16 | $F_{OUT} = 2.00 * F_{CLK}$ |
| 8 | 1 | 8 | 1/8 | 18 | 1/18 | $F_{OUT} = 2.25 * F_{CLK}$ |
| 8 | 1 | 8 | 1/8 | 20 | 1/20 | $F_{OUT} = 2.50 * F_{CLK}$ |
| 8 | 1 | 8 | 1/8 | 22 | 1/22 | $F_{OUT} = 2.75 * F_{CLK}$ |
| 8 | 1 | 8 | 1/8 | 24 | 1/24 | $F_{OUT} = 3.00 * F_{CLK}$ |
| 8 | 1 | 8 | 1/8 | 26 | 1/26 | $F_{OUT} = 3.25 * F_{CLK}$ |
| 8 | 1 | 8 | 1/8 | 28 | 1/28 | $F_{OUT} = 3.50 * F_{CLK}$ |
| 8 | 1 | 8 | 1/8 | 30 | 1/30 | $F_{OUT} = 3.75 * F_{CLK}$ |
| 8 | 1 | 8 | 1/8 | 32 | 1/32 | $F_{OUT} = 4.00 * F_{CLK}$ |

(N = 8)

In embodiments of the present systems and methods in which N=16, eighth-integer multiples of the input frequency ($F_{CLK}$) can be obtained by selection of various different values that make up the ratio $$\frac{T_{CLK}}{(N*D)}.$$

Table 3 below gives a few such examples (for multipliers between 1.000 and 4.000, inclusive), though Table 3 is by no means exhaustive, and is provided for illustration and not by way of limitation. Nor is N limited to being equal to one of the values 4, 8, or 16, as those of skill in the relevant art will understand that other values of N could be used in various different contexts.

TABLE 3

| N | D | (N * D) | $F_{OUT}$ | $T_{CLK}$ | $F_{CLK}$ | Multiplier |
|---|---|---------|-----------|-----------|-----------|------------|
| 16 | 1 | 16 | 1/16 | 16 | 1/16 | $F_{OUT} = 1.000 * F_{CLK}$ |
| 16 | 1 | 16 | 1/16 | 18 | 1/18 | $F_{OUT} = 1.125 * F_{CLK}$ |
| 16 | 1 | 16 | 1/16 | 20 | 1/20 | $F_{OUT} = 1.250 * F_{CLK}$ |
| 16 | 1 | 16 | 1/16 | 22 | 1/22 | $F_{OUT} = 1.375 * F_{CLK}$ |
| 16 | 1 | 16 | 1/16 | 24 | 1/24 | $F_{OUT} = 1.500 * F_{CLK}$ |
| 16 | 1 | 16 | 1/16 | 26 | 1/26 | $F_{OUT} = 1.625 * F_{CLK}$ |
| 16 | 1 | 16 | 1/16 | 28 | 1/28 | $F_{OUT} = 1.750 * F_{CLK}$ |
| 16 | 1 | 16 | 1/16 | 30 | 1/30 | $F_{OUT} = 1.875 * F_{CLK}$ |
| 16 | 1 | 16 | 1/16 | 32 | 1/32 | $F_{OUT} = 2.000 * F_{CLK}$ |
| 16 | 1 | 16 | 1/16 | 34 | 1/34 | $F_{OUT} = 2.125 * F_{CLK}$ |
| 16 | 1 | 16 | 1/16 | 36 | 1/36 | $F_{OUT} = 2.250 * F_{CLK}$ |
| 16 | 1 | 16 | 1/16 | 38 | 1/38 | $F_{OUT} = 2.375 * F_{CLK}$ |
| 16 | 1 | 16 | 1/16 | 40 | 1/40 | $F_{OUT} = 2.500 * F_{CLK}$ |
| 16 | 1 | 16 | 1/16 | 42 | 1/42 | $F_{OUT} = 2.625 * F_{CLK}$ |
| 16 | 1 | 16 | 1/16 | 44 | 1/44 | $F_{OUT} = 2.750 * F_{CLK}$ |
| 16 | 1 | 16 | 1/16 | 46 | 1/46 | $F_{OUT} = 2.875 * F_{CLK}$ |
| 16 | 1 | 16 | 1/16 | 48 | 1/48 | $F_{OUT} = 3.000 * F_{CLK}$ |
| 16 | 1 | 16 | 1/16 | 50 | 1/50 | $F_{OUT} = 3.125 * F_{CLK}$ |
| 16 | 1 | 16 | 1/16 | 52 | 1/52 | $F_{OUT} = 3.250 * F_{CLK}$ |
| 16 | 1 | 16 | 1/16 | 54 | 1/54 | $F_{OUT} = 3.375 * F_{CLK}$ |
| 16 | 1 | 16 | 1/16 | 56 | 1/56 | $F_{OUT} = 3.500 * F_{CLK}$ |
| 16 | 1 | 16 | 1/16 | 58 | 1/58 | $F_{OUT} = 3.625 * F_{CLK}$ |
| 16 | 1 | 16 | 1/16 | 60 | 1/60 | $F_{OUT} = 3.750 * F_{CLK}$ |
| 16 | 1 | 16 | 1/16 | 62 | 1/62 | $F_{OUT} = 3.875 * F_{CLK}$ |
| 16 | 1 | 16 | 1/16 | 64 | 1/64 | $F_{OUT} = 4.000 * F_{CLK}$ |

(N = 16)

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element preceded by "comprises . . . a," "has . . . a," "includes . . . a," "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting embodiment the term is defined to be within 1%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A circuit system comprising a frequency-multiplication circuit, the frequency-multiplication circuit comprising:
a ring of a number (N) of serially connected delay-buffer elements that each provide an equal time delay (D), at least some of the delay-buffer elements having at least one pulse-locking injection port, the pulse-locking injection port being an edge driven pulse-locking injection port, the ring having a ring output port; and
an injection-pulse-generation circuit comprising:
a clock input port configured to receive a clock signal having a clock-signal frequency ($F_{CLK}$) and a corresponding clock-signal period ($T_{CLK}$);
a pulse-selection input port configured to receive pulse-selection control signals;
a plurality of injection-pulse output ports connected to respective pulse-locking injection ports of the delay-buffer elements; and
balanced-delay selection-logic circuitry connected to the clock input port, the pulse-selection input port, and the injection-pulse output ports,
wherein the injection-pulse generation circuit is configured to:
generate balanced-delay injection-pulse signals by applying the balanced-delay selection-logic circuitry to the clock signal according to the pulse-selection control signals by generating one or more falling-edge injection-pulse signals responsive to one or more respective falling edges of the clock signal; and
provide an injection-locked, frequency-multiplied ring output signal at the ring output port by transmitting the generated balanced-delay injection-pulse signals via the injection-pulse output ports to the respectively connected pulse-locking injection ports, the ring output signal having an output-signal frequency ($F_{OUT}$) that equals the reciprocal of (N*D) and that bears the same proportional relationship to $F_{CLK}$ that $T_{CLK}$ bears to (N*D).

2. The circuit system of claim 1, further comprising a clock-generation circuit configured to transmit the clock signal to the injection-pulse-generation circuit.

3. The circuit system of claim 1, further comprising a controller configured to transmit the pulse-selection control signals to the injection-pulse-generation circuit.

4. The circuit system of claim 1, wherein N is an even number.

5. The circuit system of claim 4, wherein N equals 4.

6. The circuit system of claim 4, wherein N equals 8.

7. The circuit system of claim 4, wherein N equals 16.

8. The circuit system of claim 1, wherein at least one of the delay-buffer elements comprises a pair of inverter circuits.

9. A circuit system comprising a frequency-multiplication circuit, the frequency-multiplication circuit comprising:
a ring of a number (N) of serially connected delay-buffer elements that each provide an equal time delay (D), at least some of the delay-buffer elements having at least one pulse-locking injection port, the pulse-locking injection port being an edge driven pulse-locking injection port, the ring having a ring output port; and
an injection-pulse-generation circuit comprising:
a clock input port configured to receive a clock signal having a clock-signal frequency ($F_{CLK}$) and a corresponding clock-signal period ($T_{CLK}$);
a pulse-selection input port configured to receive pulse-selection control signals;
a plurality of injection-pulse output ports connected to respective pulse-locking injection ports of the delay-buffer elements, wherein each of the delay-buffer elements has at least one pulse-locking injection port connected to a respective one of the injection-pulse output ports of the injection-pulse generation circuit, wherein each of those pulse-locking injection ports comprises a rising-edge pulse-locking injection port;
balanced-delay selection-logic circuitry connected to the clock input port, the pulse-selection input port, and the injection-pulse output ports, wherein the injection-pulse generation circuit is configured to:

generate balanced-delay injection-pulse signals by applying the balanced-delay selection-logic circuitry to the clock signal according to the pulse-selection control, provide an injection-locked, frequency-multiplied ring output signal at the ring output port by transmitting the generated balanced-delay injection-pulse signals via the injection-pulse output ports to the respectively connected pulse-locking injection ports, the ring output signal having an output-signal frequency ($F_{OUT}$) that equals the reciprocal of (N*D) and that bears the same proportional relationship to $F_{CLK}$ that $T_{CLK}$ bears to (N*D).

10. The circuit system of claim 9, wherein each of those pulse-locking injection ports further comprises a falling-edge pulse-locking injection port.

11. A circuit system comprising a frequency-multiplication circuit, the frequency-multiplication circuit comprising:

a ring of a number (N) of serially connected delay-buffer elements that each provide an equal time delay (D), at least some of the delay-buffer elements having at least one pulse-locking injection port, the pulse-locking injection port being an edge driven pulse-locking injection port, the ring having a ring output port; and an injection-pulse-generation circuit comprising:

a clock input port configured to receive a clock signal having a clock-signal frequency ($F_{CLK}$) and a corresponding clock-signal period ($T_{CLK}$);

a pulse-selection input port configured to receive pulse-selection control signals;

a plurality of injection-pulse output ports connected to respective pulse-locking injection ports of the delay-buffer elements; and balanced-delay selection-logic circuitry connected to the clock input port, the pulse-selection input port, and the injection-pulse output ports, wherein the injection-pulse generation circuit is configured to:

generate balanced-delay injection-pulse signals by applying the balanced-delay selection-logic circuitry to the clock signal according to the pulse-selection control signals by generating one or more rising-edge injection-pulse signals responsive to one or more respective rising edges of the clock signal; and provide an injection-locked, frequency-multiplied ring output signal at the ring output port by transmitting the generated balanced-delay injection-pulse signals via the injection-pulse output ports to the respectively connected pulse-locking injection ports, the ring output signal having an output-signal frequency ($F_{OUT}$) that equals the reciprocal of (N*D) and that bears the same proportional relationship to $F_{CLK}$ that $T_{CLK}$ bears to (N*D).

12. The circuit system of claim 11, wherein generating the balanced-delay injection-pulse signals by applying the balanced-delay selection-logic circuitry to the clock signal according to the pulse-selection control signals further comprises generating one or more falling-edge injection-pulse signals responsive to one or more respective falling edges of the clock signal.

13. A circuit system comprising a frequency-multiplication circuit, the frequency-multiplication circuit comprising:

a ring of a number (N) of serially connected delay-buffer elements that each provide an equal time delay (D), at least some of the delay-buffer elements having at least one pulse-locking injection port, the pulse-locking injection port being an edge driven pulse-locking injection port, the ring having a ring output port; and an injection-pulse-generation circuit comprising:

a clock input port configured to receive a clock signal having a clock-signal frequency ($F_{CLK}$) and a corresponding clock-signal period ($T_{CLK}$);

a pulse-selection input port configured to receive pulse-selection control signals;

a plurality of injection-pulse output ports connected to respective pulse-locking injection ports of the delay-buffer elements; and balanced-delay selection-logic circuitry connected to the clock input port, the pulse-selection input port, and the injection-pulse output ports, wherein the injection-pulse generation circuit is configured to:

generate balanced-delay injection-pulse signals by applying the balanced-delay selection-logic circuitry to the clock signal according to the pulse-selection control signals; and provide an injection-locked, frequency-multiplied ring output signal at the ring output port by transmitting the generated balanced-delay injection-pulse signals via the injection-pulse output ports to the respectively connected pulse-locking injection ports, the ring output signal having an output-signal frequency ($F_{OUT}$) that equals the reciprocal of (N*D) and that bears the same proportional relationship to $F_{CLK}$ that $T_{CLK}$ bears to (N*D), wherein:

the injection-pulse-generation circuit further comprises an inverse-clock input port configured to receive an inverse clock signal, the inverse clock signal having an inverse-clock-signal frequency ($F_{\overline{CLK}}$) equal to $F_{CLK}$, the inverse clock signal being out of phase with the clock signal by 180 degrees; and the injection-pulse-generation circuit is further configured to generate the injection-pulse signals by applying the balanced-delay selection-logic circuitry to the inverse clock signal according to the pulse-selection control signals;

wherein generating the injection-pulse signals by applying the balanced-delay selection-logic circuitry to the clock signal and to the inverse clock signal according to the pulse-selection control signals comprises alternating between:

generating (i) one or more rising-edge injection-pulse signals responsive to a rising edge of the clock signal and (ii) one or more falling-edge injection-pulse signals responsive to a falling edge of the inverse clock signal; and generating (i) one or more rising-edge injection-pulse signals responsive to a rising edge of the inverse clock signal, and (ii) one or more falling-edge injection-pulse signals responsive to a falling edge of the clock signal.

14. A circuit system comprising a frequency-multiplication circuit, the frequency-multiplication circuit comprising:

a ring of a number (N) of serially connected delay-buffer elements that each provide an equal time delay (D), at least some of the delay-buffer elements having at least one pulse-locking injection port, the pulse-locking injection port being an edge driven pulse-locking injection port, the ring having a ring output port; and an injection-pulse-generation circuit comprising:

a clock input port configured to receive a clock signal having a clock-signal frequency ($F_{CLK}$) and a corresponding clock-signal period ($T_{CLK}$);

a pulse-selection input port configured to receive pulse-selection control signals;

a plurality of injection-pulse output ports connected to respective pulse-locking injection ports of the delay-buffer elements; and balanced-delay selection-logic circuitry connected to the clock input port, the pulse-selection input port, and the injection-pulse output ports, wherein the injection-pulse generation circuit is configured to:

generate balanced-delay injection-pulse signals by applying the balanced-delay selection-logic circuitry to the clock signal according to the pulse-selection control signals; and provide an injection-locked, frequency-multiplied ring output signal at the ring output port by transmitting the generated balanced-delay injection-pulse signals via the injection-pulse output ports to the respectively connected pulse-locking injection ports, the ring output signal having an output-signal frequency ($F_{OUT}$) that equals the reciprocal of (N*D) and that bears the same proportional relationship to $F_{CLK}$ that $T_{CLK}$ bears to (N*D);

wherein the frequency-multiplication circuit comprises N output ports including the ring output port, the N output ports being connected to outputs of the respective N delay-buffer elements, the N output ports collectively providing N different phase-offset, injection-locked, frequency-multiplied output signals including the ring output signal, each of the N output signals having a frequency equal to $F_{OUT}$;

further comprising an output-signal-processing circuit configured to:

receive and generate a duty-cycle-reduced version of each of the N different phase-offset, injection-locked, frequency-multiplied output signals; and output the generated N different duty-cycle-reduced versions, each duty-cycle-reduced version having a duty cycle equal to $$\frac{100\%}{N};$$

and wherein the output-signal-processing circuit being configured to output the generated N different duty-cycle-reduced versions comprises the output-signal-processing circuit being configured to output the generated N different duty-cycle-reduced versions to an N-path network.

* * * * *